US012795831B2

(12) United States Patent
Kim et al.

(10) Patent No.: US 12,795,831 B2
(45) Date of Patent: Nov. 10, 2026

(54) DISPLAY APPARATUS

(71) Applicant: SAMSUNG ELECTRONICS CO., LTD., Suwon-si (KR)

(72) Inventors: Sujin Kim, Suwon-si (KR); Jungmo Kang, Suwon-si (KR); Myungjoon Kim, Suwon-si (KR); Hyungjin Kim, Suwon-si (KR); Seungyong Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 19/245,882

(22) Filed: Jun. 23, 2025

(65) Prior Publication Data

US 2026/0107385 A1 Apr. 16, 2026

Related U.S. Application Data

(63) Continuation of application No. PCT/KR2025/008187, filed on Jun. 13, 2025.

(30) Foreign Application Priority Data

Aug. 29, 2024 (KR) ........................ 10-2024-0116726
Nov. 6, 2024 (KR) ........................ 10-2024-0156613

(51) Int. Cl.
*H05K 1/14* (2006.01)
*F21V 23/00* (2015.01)
(Continued)

(52) U.S. Cl.
CPC ....... *H05K 1/142* (2013.01); *G02F 1/133603* (2013.01); *G02F 1/133606* (2013.01);
(Continued)

(58) Field of Classification Search
CPC ............... F21V 23/002; F21Y 2105/14; F21Y 2105/16; F21Y 2105/18; G02F 1/133603;
(Continued)

(56) References Cited

U.S. PATENT DOCUMENTS 9,383,069 B2 7/2016 Lankhorst et al.
2007/0242477 A1* 10/2007 Yoo ...................... H05K 1/0206 362/612
(Continued)

FOREIGN PATENT DOCUMENTS

CN 220475995 U 2/2024
JP 2015-530731 A 10/2015
(Continued)

*Primary Examiner* — Keith G. Delahoussaye
(74) *Attorney, Agent, or Firm* — Sughrue Mion, PLLC

(57) ABSTRACT

A display apparatus includes: a display panel; a plurality of light sources configured to emit light toward the display panel; and a light source substrate on which the plurality of light sources are provided, where the light source substrate includes: a substrate body extending in a first direction; a plurality of substrate bars spaced apart from each other in the first direction and extending from one side of the substrate body in a second direction that is different from the first direction; and a substrate line connected to at least some of the plurality of light sources, where the at least some of the plurality of light sources are provided as a plurality of dimming blocks on a first substrate bar, each dimming block including a preset number of light sources among the at least some of the plurality of light sources.

19 Claims, 16 Drawing Sheets

(51) Int. Cl.
*F21Y 105/14* (2016.01)
*G02F 1/13357* (2006.01)
*H05K 1/18* (2026.01)

(52) U.S. Cl.
CPC .............. *H05K 1/18* (2013.01); *F21V 23/002* (2013.01); *F21Y 2105/14* (2016.08); *H05K 2201/09* (2013.01); *H05K 2201/10106* (2013.01)

(58) Field of Classification Search
CPC .... G02F 1/133606; H05K 1/142; H05K 1/18; H05K 2201/10106
See application file for complete search history.

(56) References Cited

U.S. PATENT DOCUMENTS

| | | | | |
|---|---|---|---|---|
| 2009/0109655 A1* | 4/2009 | Shinozaki | G02F 1/133603 | 362/234 |
| 2009/0316389 A1* | 12/2009 | Park | G02F 1/133603 | 362/382 |
| 2010/0165240 A1* | 7/2010 | Cho | G02F 1/133603 | 349/61 |
| 2013/0182438 A1* | 7/2013 | Cobb | H05K 3/0052 | 362/249.02 |
| 2015/0198293 A1* | 7/2015 | Lankhorst | H05K 3/0097 | 362/249.02 |

FOREIGN PATENT DOCUMENTS

| | | |
|---|---|---|
| JP | 2020-095848 A | 6/2020 |
| KR | 10-2020-0068314 A | 6/2020 |

* cited by examiner

DISPLAY APPARATUS

CROSS-REFERENCE TO RELATED APPLICATION(S)

This application is a continuation of International Application No. PCT/KR2025/008187, filed on Jun. 13, 2025, in the Korean Intellectual Property Receiving Office, which is based on and claims priority to Korean Patent Application No. 10-2024-0116726, filed on Aug. 29, 2024 and Korean Patent Application No. 10-2024-0156613, filed on Nov. 6, 2024, in the Korean Intellectual Property Office, the disclosures of which are incorporated by reference herein in their entireties.

BACKGROUND

1. Field

The present disclosure relates to a display apparatus.

2. Description of Related Art

Display apparatuses are a type of output device that converts acquired or stored electrical information into visual information and displays the visual information to a user and are used in various fields such as in homes or businesses.

Examples of display apparatuses include monitor devices connected to personal computers or server computers, portable computer devices, navigation terminal devices, general television devices, Internet protocol television (IPTV) devices, portable terminal devices such as smart phones, tablet PCs, personal digital assistants (PDA), and cellular phones, and various types of display apparatuses used in industrial fields for playing images such as advertisements or movies, or various other types of audio/video systems.

A display apparatus may include a light source module configured to convert electrical information into visual information, and the light source module may include a plurality of light sources configured to emit light independently.

Each of the plurality of light sources may include, for example, a light emitting diode (LED) or an organic light emitting diode (OLED). For example, the LED or OLED may be mounted on a circuit board or substrate.

SUMMARY

Provided is a display apparatus having an improved structure to increase layout efficiency of a substrate line on a light source substrate.

Provided is a display apparatus having an improved structure to reduce the number of electronic parts mounted on a light source substrate by decreasing intersections between substrate lines.

Provided is a display apparatus having an improved structure in which a substrate line is efficiently arranged on a single-sided mounting type light source substrate.

Provided is a display apparatus having an improved structure to increase efficiency of a manufacturing process of a light source device and reduce manufacturing costs.

Additional aspects will be set forth in part in the description which follows and, in part, will be apparent from the description, or may be learned by practice of the presented embodiments.

According to an aspect of the disclosure, a display apparatus may include: a display panel; a plurality of light sources configured to emit light toward the display panel; and a light source substrate on which the plurality of light sources are provided. The light source substrate may include: a substrate body extending in a first direction; a plurality of substrate bars spaced apart from each other in the first direction and extending from one side of the substrate body in a second direction that is different from the first direction; and a substrate line connected to at least some of the plurality of light sources. The at least some of the plurality of light sources may be provided as a plurality of dimming blocks on a first substrate bar, each dimming block including a preset number of light sources among the at least some of the plurality of light sources. The substrate line may include a dimming block line connected to at least one light source of each of the plurality of dimming blocks. At least one portion of the dimming block line may be between an edge of the first substrate bar and the at least some of the plurality of light sources.

The substrate line may further include a light source inter-line connecting the light sources of each dimming block among the plurality of dimming blocks. The at least one portion of the dimming block line may be closer to the edge of the first substrate bar than the light source inter-line.

At least one second portion of the dimming block line may be between an edge of the substrate body and the at least some of the plurality of light sources.

The at least one second portion of the dimming block line may be adjacent to the edge of the substrate body. The edge of the substrate body may be opposite to the plurality of substrate bars.

The dimming block line may include a voltage line connected to a first light source of each dimming block among the plurality of dimming blocks, the voltage line configured to apply a driving voltage to each of the plurality of dimming blocks. A portion of the voltage line may be between a first edge of the first substrate bar and the at least some of the plurality of light sources.

A second portion of the voltage line may be between an edge of the substrate body and the at least some of the plurality of light sources.

The voltage line may include: a main line integrally formed between the first edge of the first substrate bar and the at least some of the plurality of light sources; and a branched line branched from the main line and connected to the first light source of each dimming block among the plurality of dimming blocks.

Among the light sources of each dimming block, one or more light sources may be aligned with the first light source in the second direction. The first light source may be closer to the substrate body than the one or more light sources.

The display apparatus may further include a driving circuit on the light source substrate and configured to control a driving current supplied to the light sources of the plurality of dimming blocks. The dimming block line may include a control line connecting the driving circuit and a second light source of each dimming block. The control line may be between a second edge of the first substrate bar and the at least some of the plurality of light sources.

The substrate line may further include a light source inter-line connecting the light sources of each dimming block among the plurality of dimming blocks. The control line may include a plurality of control lines. The plurality of control lines may be closer to the second edge of the first substrate bar than the light source inter-line.

Among the light sources of each dimming block, one or more light sources may be aligned with the second light source in the second direction. The second light source may be closer to the substrate body than the one or more light sources.

Each of the plurality of substrate bars may include: a central extension extending in the second direction; a plurality of first protrusions protruding from a first side of the central extension in the first direction and provided with some of the plurality of light sources; and a plurality of second protrusions protruding from a second side of the central extension in the first direction and provided with others of the plurality of light sources. On the first substrate bar, a first portion of the dimming block line may be provided along edges of a plurality of first protrusions of the first substrate bar. A second portion of the dimming block line may be provided along edges of a plurality of second protrusions of the first substrate bar.

The at least some of the plurality of light sources may include: a plurality of first-side light sources on the plurality of first protrusions of the first substrate bar; and a plurality of second-side light sources on the plurality of second protrusions of the first substrate bar. The first portion of the dimming block line may be between the plurality of first-side light sources and the edges of the plurality of first protrusions. The second portion of the dimming block line may be between the plurality of second-side light sources and the edges of the plurality of second protrusions.

The dimming block line may further include: a voltage line connected to a first light source of each dimming block among the plurality of dimming blocks and configured to apply a driving voltage to each of the plurality of dimming blocks; and a control line connected to a second light source of each dimming block among the plurality of dimming blocks and configured to control a driving current supplied to each of the plurality of dimming blocks. The voltage line may be between the plurality of first-side light sources and the edges of the plurality of first protrusions. The control line may be between the plurality of second-side light sources and the edges of the plurality of second protrusions.

The plurality of substrate bars may include the first substrate bar, and a second substrate bar adjacent to the first substrate bar. A distance between a light source at a first edge of the first substrate bar that is adjacent to the second substrate bar and a light source at a second edge of the first substrate bar that is opposite to the second substrate bar may be less than a distance between the light source at the first edge of the first substrate bar and a light source at an edge of the second substrate bar that is adjacent to the first substrate bar.

According to an aspect of the disclosure, a display apparatus may include: a display panel; a light source substrate; and a plurality of light sources on the light source substrate and configured to emit light toward the display panel. The light source substrate may include: a substrate body extending in a first direction; a plurality of substrate bars spaced apart from each other in the first direction and extending from one side of the substrate body in a second direction that is different from the first direction; and a substrate line connected to at least some of the plurality of light sources. Each of the plurality of substrate bars may include: a central extension extending in the second direction; and a plurality of protrusions protruding from a side of the central extension in the first direction and provided with the at least some of the plurality of light sources. The at least some of the plurality of light sources may be provided as a plurality of dimming blocks on a first substrate bar, each dimming block including a preset number of light sources among the at least some of the plurality of light sources. The substrate line may include a dimming block line connected to at least one light source of each of the plurality of dimming blocks. At least one portion of the dimming block line may be between an edge of the first substrate bar and the at least some of the plurality of light sources.

The dimming block line may include a voltage line connected to a first light source of each dimming block among the plurality of dimming blocks, the voltage line configured to apply a driving voltage to each of the plurality of dimming blocks. A portion of the voltage line may be between a first edge of the first substrate bar and the at least some of the plurality of light sources.

The display apparatus may further include a driving circuit on the light source substrate and configured to control a driving current supplied to the light sources of the plurality of dimming blocks, where the dimming block line includes a control line connecting the driving circuit and a second light source of each dimming block. The control line may be between an edge of the first substrate bar and the at least some of the plurality of light sources.

The plurality of protrusions may include: a plurality of first protrusions protruding from a first side of the central extension in the first direction outward from the central extension and provided with some of the plurality of light sources; and a plurality of second protrusions protruding from a second side of the central extension in the first direction outward from the central extension and provided with others of the plurality of light sources. The at least some of the plurality of light sources may include: a plurality of first-side light sources on the plurality of first protrusions; and a plurality of second-side light sources on the plurality of second protrusions.

The voltage line may be between the plurality of first-side light sources and edges of the plurality of first protrusions. The control line may be between the plurality of second-side light sources and edges of the plurality of second protrusions.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
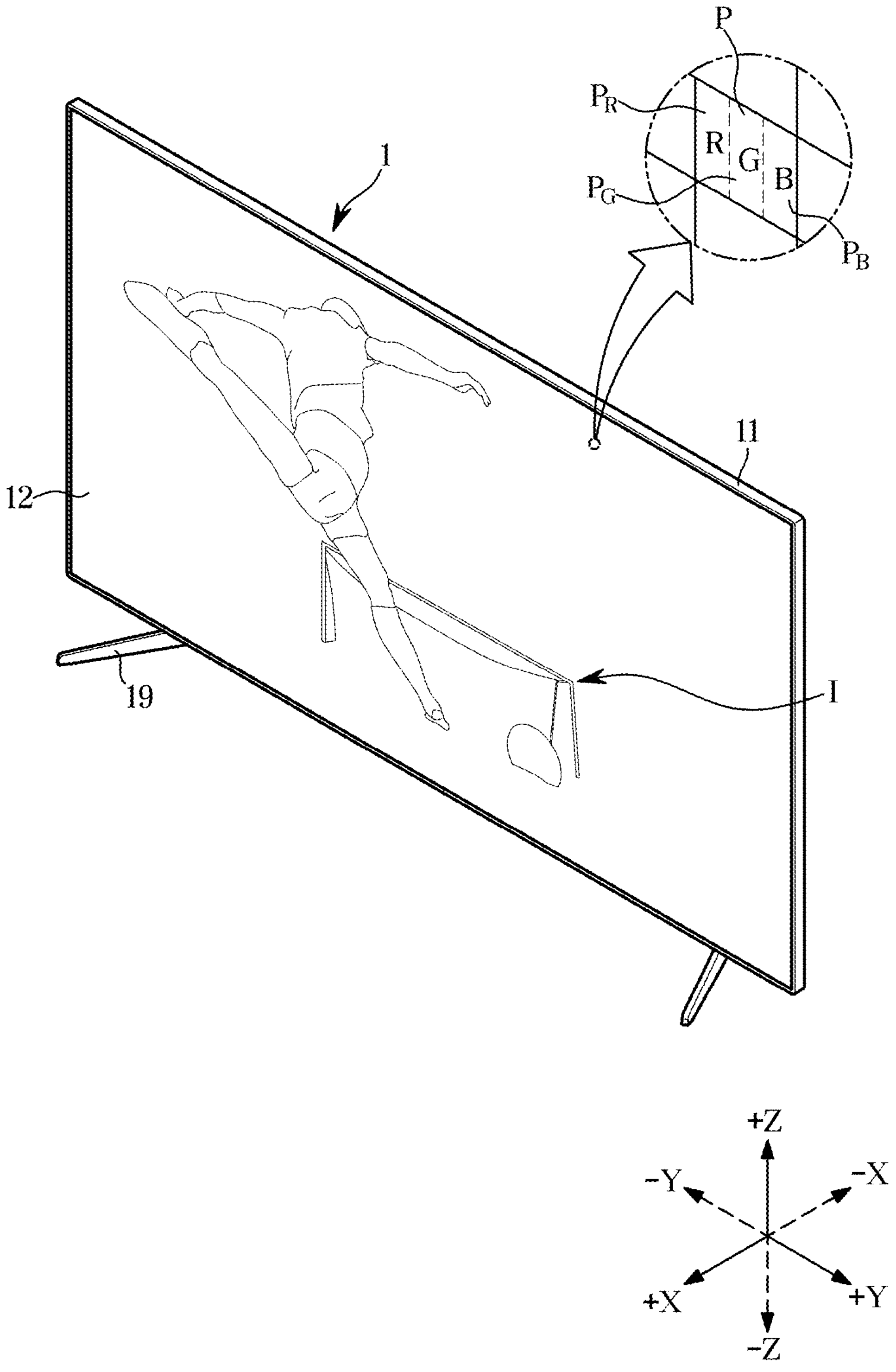
FIG. 1 is a view illustrating a display apparatus according to an embodiment of the present disclosure.

The embodiments described in the specification and shown in the drawings are only illustrative and are not intended to represent all aspects of the present disclosure, such that various equivalents and modifications may be made without departing from the spirit of the present disclosure.

In addition, like reference numerals denote like elements or components having substantially same functions in the drawings.

In addition, the terms used herein are merely used to describe particular embodiments, and are not intended to limit the present disclosure. Therefore, an expression used in the singular encompasses the expression of the plural, unless it should be clearly singular in the context. In addition, it is to be understood that the terms such as "including" or "having" are intended to indicate the existence of features, numbers, steps, operations, components, parts, or combinations thereof disclosed in the specification, and are not intended to preclude the possibility that other features, numbers, steps, operations, components, parts, or combinations thereof may exist or may be added.

In addition, it will be understood that, although the terms "first", "second", etc., may be used herein to describe various elements, these elements should not be limited by these terms. The above terms are used only to distinguish one component from another. For example, a first component discussed below could be termed a second component, and similarly, the second component may be termed the first component without departing from the teachings of this disclosure. The term "and/or" includes any and all combinations of one or more of the associated listed items.

Meanwhile, the terms used throughout the specification "up-down direction", "lower", and "forward-backward direction", and the like are defined based on the drawings and the shape and position of each element are not limited by these terms.

Hereinafter, various embodiments according to the present disclosure will be described in detail with reference to the drawings.

In the following description of the embodiments of the present disclosure with reference to FIGS. 1 to 16, the terms used herein such as "in front of", "behind", "upward", "downward", "vertical direction", and "horizontal direction (lateral direction)", are defined based on the drawings, and the shapes and positions of the components are not limited by these terms. For example, the term "forward-backward direction" as used herein may refer to a direction parallel to the X-axis direction based on the drawing. For example, the term "vertical direction" may refer to a direction parallel to the Z-axis direction, and the terms "upward" and "downward" may refer to an upward direction in the Z-axis direction and a downward direction in the Z-axis direction, respectively, based on the drawing. For example, the term "horizontal direction (lateral direction)" may refer to a direction parallel to the Y-axis based on the drawing.

FIG. 1 is a view illustrating a display apparatus according to an embodiment of the present disclosure.

Referring to FIG. 1, a display apparatus 1 according to an embodiment of the present disclosure is an apparatus configured to process an image signal received from the outside and visually display the processed image. The display apparatus 1 may be implemented in various forms such as a television (TV), a monitor as a type of computer output device, a portable multimedia device, or a portable communication device.

Also, the display apparatus 1 may be a large format display (LFD) installed outdoors such as on a rooftop of a building or at a bus stop. In this regard, the outdoors are not necessarily limited to open-air environments, but the display apparatus 1 according to an embodiment of the present disclosure may be installed in any location where a large number of people may pass through such as subway stations, shopping malls, movie theaters, offices, and retail stores.

The display apparatus 1 may be configured in various ways without being limited to the above-described examples as long as the display apparatus 1 visually displays an image.

Although FIG. 1 shows an embodiment in which the display apparatus 1 is a flat display apparatus having a flat screen, the embodiment of the present disclosure is not limited thereto. According to various embodiments of the present disclosure, the display apparatus 1 may be a curved display apparatus, or a bendable or flexible display apparatus, the shape of which is convertible between a flat state and a curved state.

Although FIG. 1 shows an embodiment in which the display apparatus 1 has a rectangular plate shape with a width and a height different from each other, the display apparatus 1 may have a shape in which a width and a height are almost the same.

The display apparatus 1 may receive content including video signals and audio signals from various content sources and output videos and audios corresponding to the video signals and the audio signals. For example, the display apparatus 1 may receive content data via a broadcast reception antenna or a wired cable, from a content playback device, or from a content provider's content delivery server.

The display apparatus 1 may display images corresponding to the video data and output sounds corresponding to the audio data. For example, the display apparatus 1 may restore a plurality of image frames included in video data and consecutively display the plurality of image frames. In addition, the display apparatus 1 may restore audio signals included in the audio data and continuously output sounds in accordance with the audio signals.

As shown in FIG. 1, the display apparatus 1 may include a main body 11 and a screen 12 configured to display an image I.

The display apparatus 1 may be installed on indoor or outdoor floors or on furniture in a standing manner or may be hung on a wall in a wall-mounted form or in an embedded manner. For example, the display apparatus 1 may include support legs 19 provided on the bottom of the main body 11 for installation on indoor or outdoor floors or on furniture in a standing manner.

The main body 11 may form the exterior appearance of the display apparatus 1. Parts used to perform various functions of the display apparatus 1, for example, displaying an image may be provided inside the main body 11.

The display apparatus 1 may be configured to display an image I. Specifically, the screen 12 may be formed on the front surface of the main body 11, and the display apparatus 1 may display an image I via the screen 12. For example, the screen 12 may display a still image or a moving image. In addition, the screen 12 may display a two-dimensional plane image or a three-dimensional stereoscopic image using the parallax between two eyes of a user.

A plurality of pixels P may be formed at the screen 12. The image I displayed on the screen 12 may be formed by light emitted by each of the plurality of pixels P. For example, the image I may be formed on the screen 12 via combination of light beams emitted from the plurality of pixels P like a mosaic.

The plurality of pixels P may emit light beams with various luminance and colors. According to an embodiment, each of the plurality of pixels P may include sub-pixels PR, PG, and PB, and the sub-pixels PR, PG, and PB may include a red sub-pixel PR configured to emit red light, a green sub-pixel PG configured to emit green light, and a blue sub-pixel PB configured to emit blue light. For example, red light may represent light with a wavelength of approximately 620 nm (nanometer, one 10 billionth of a meter) to 750 nm, green light may represent light with a wavelength of approximately 495 nm to 570 nm, and blue light may represent light with a wavelength of approximately 450 nm to 495 nm.

By combinations of light beams emitted from the red sub-pixel PR, the green sub-pixel PG, and the blue sub-pixel PB, each of the plurality of pixels P may emit light with various luminance and colors.

Figure 2:
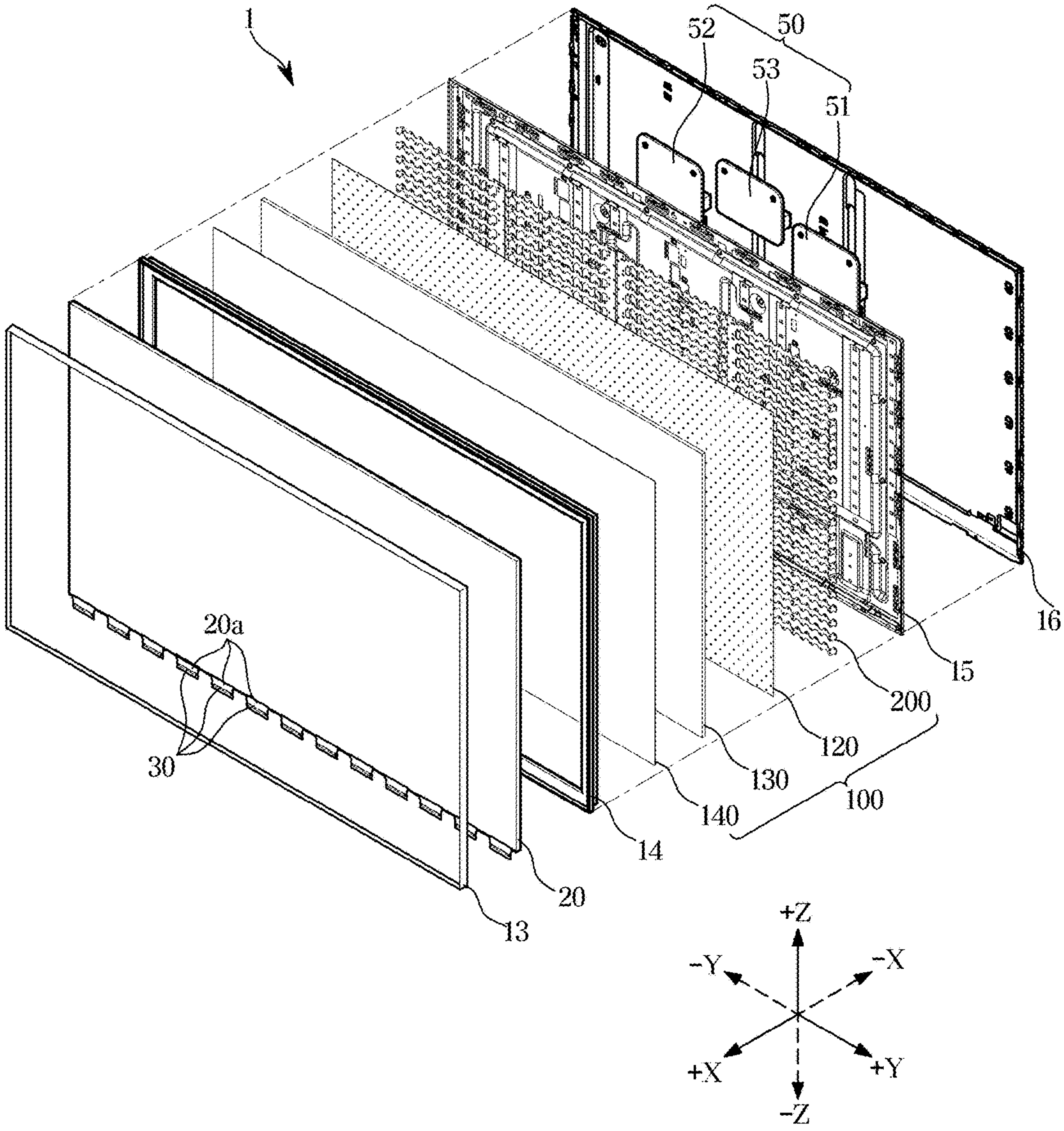
FIG. 2 is an exploded view of a display apparatus according to an embodiment of the present disclosure.

FIG. 2 is an exploded view of a display apparatus according to an embodiment of the present disclosure.

Referring to FIG. 2, various parts used to generate an image I on the screen 12 may be provided in the main body 11 of the display apparatus 1 according to an embodiment of the present disclosure.

For example, the display apparatus 1 may include a display panel 20. The display panel 20 may be provided in the main body 11. The display panel 20 may be provided to display an image I. The screen 12 described in FIG. 1 may be formed on the front surface of the display panel 20.

For example, the display panel 20 may have an approximately rectangular shape. According to an embodiment, the display panel 20 may have a shape with a width and a height different from each other. That is, the display panel 20 may be provided to have a long side and a short side. The display panel 20 may be provided to have a rectangular plate shape. However, the disclosure is not limited thereto, and the display panel 20 may be provided in a square plate shape in which a width and a height are almost the same.

The display panel 20 may be provided in various sizes. A ratio of the long side to the short side of the display panel 20 is not limited to common ratios such as 16:9 or 4:3 but may be set to any arbitrary ratio.

In the display apparatus 1 according to an embodiment of the present disclosure, the display panel 20 may be configured as a light-receiving/emitting display type such as a liquid crystal display (LCD).

A cable 20*a* for transmitting image data to the display panel 20, and a display driver integrated circuit (DDI, hereinafter, referred to as driver IC) configured to process digital image data and output analog image signals may be provided on one side of the display panel 20.

The cable 20*a* may electrically connect a printed circuit board assembly (PBA) 50 and the driver IC 30 and electrically connect the driver IC 30 and the display panel 20. The cable 20*a* may include a flexible flat cable that is bendable, a film cable, or the like.

The driver IC 30 may receive image data and powder from the PBA 50 via the cable 20*a*, and may transmit image data and a driving current to the display panel 20 via the cable 20*a*.

In addition, the cable 20*a* and the driver IC 30 may be implemented as a single unit such as a film cable, a chip on film (COF), and a tape carrier packet (TCP). In other words, the driver IC 30 may be disposed on the cable 20*a*. However, the embodiment is not limited thereto, and the driver IC 30 may also be disposed on the display panel 20.

A structure of the display panel 20 will be described below in more detail.

The display apparatus 1 may include a backlight unit 100 configured to emit light toward the display panel 20. The backlight unit 100 may be provided in the main body 11. The backlight unit 100 may be located behind the display panel 20 and configured to emit light forward in which the display panel 20 is located. According to an embodiment, the backlight unit 100 may be implemented as a surface light source. The display panel 20 may block or transmit light emitted from the backlight unit 100.

The backlight unit 100 may include a point light source configured to emit monochromatic light or white light and may be configured to refract, reflect, and scatter light to convert light emitted from the point light source into uniform surface light. The backlight unit 100 may emit uniform surface light forward by refracting, reflecting, and scattering the light emitted from the point light source.

As shown in FIG. 2, the backlight unit 100 may include a light source device 200. The light source device 200 may generate light and emit the light. According to an embodiment, the light source device 200 may be provided to emit monochromatic light or white light.

Figure 4:
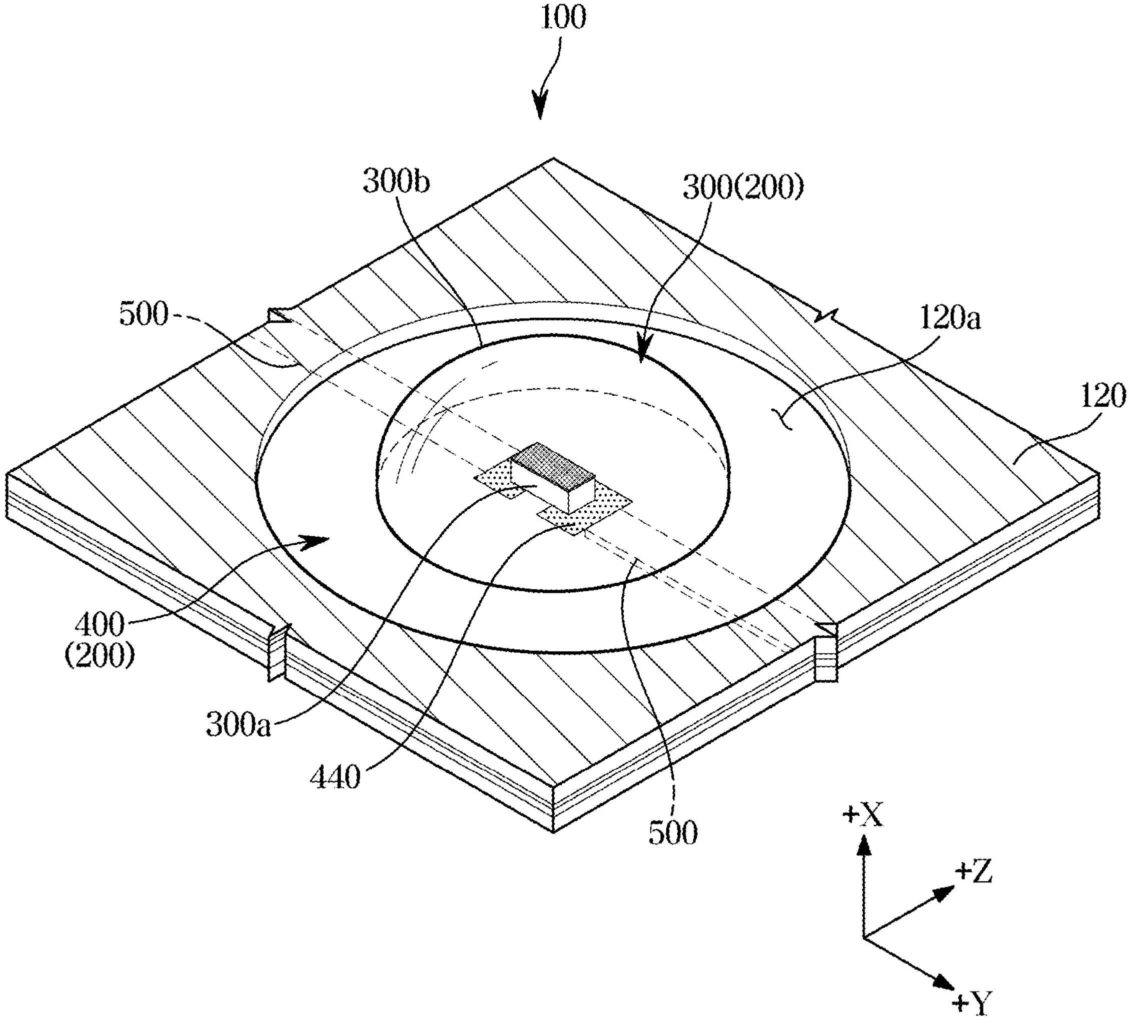
FIG. 4 is an enlarged view illustrating a light source device and a reflection sheet included in a display apparatus according to an embodiment of the present disclosure.

The light source device 200 may include a plurality of light sources 300 provided to emit light and a light source substrate 400 on which the plurality of light sources 300 are mounted (See FIG. 4, etc.).

The light source device 200 will be described below in more detail.

As shown in FIG. 2, the backlight unit 100 may include a reflection sheet 120 configured reflect light. The reflection sheet 120 may be configured to reflect light in the forward direction or in a direction approximately toward the front.

For example, the reflection sheet 120 may be attached to the front surface of the light source device 200. According to an embodiment, the reflection sheet 120 may be attached to the front surface of the light source substrate 400.

For example, the light source device 200 (specifically, the light source 300 of the light source device 200, see FIG. 4)

may emit light in various directions in front of the reflection sheet 120. Light emitted from the light source device 200 may be emitted not only toward a diffuser plate 130, which will be described below, but also toward the reflection sheet 120 from the light source device 200, and the reflection sheet 120 may reflect light proceeding toward the reflection sheet 120 toward the diffuser plate 130.

While the light emitted from the light source device 200 pass through various objects such as the diffuser plate 130 and an optical sheet 140, the light may be partially reflected by surfaces of the diffuser plate 130 and the optical sheet 140, and the reflection sheet 120 may reflect the reflected light again in the forward direction.

As shown in FIG. 2, the backlight unit 100 may include the diffuser plate 130 configured to uniformly diffuse light. The diffuser plate 130 may be disposed in front of the light source device 200 and the reflection sheet 120. The diffuser plate 130 may uniformly diffuse the light emitted from the light source device 200 and direct the light in the forward direction.

As shown in FIG. 2, the backlight unit 100 may include the optical sheet 140 configured to further enhance luminance of the emitted light and uniformity of the luminance. The optical sheet 140 may be configured to refract and scatter the light traveling from the front surface of the diffuser plate 130. For example, the optical sheet 140 may include various types of sheets such as a diffuser sheet, a prism sheet, a reflective polarizing sheet, and a quantum dot sheet.

The display apparatus 1 may include at least one PBA 50. For example, the display apparatus 1 may include a main board 51 configured to control the operation of the backlight unit 100 and the display panel 20, a driving board 53, and a power supply board 52 configured to supply power to the backlight unit 100 and the display panel 20. The main board 51, the power supply board 52, and the driving board 53 may be electrically connected to each other. Each of the main board 51, the power supply board 52, and the driving board 53 may be provided in the main body 11.

The main board 51 and/or the driving board 53 may include a control circuit configured to control the operation of the display panel 20 and the backlight unit 100. The control circuit may process image data received from an external content source, transmit image data signals to the display panel 20, and transmit dimming data signals to the backlight unit 100.

For example, the main board 51 may process video signals/audio signals, and the like and output content data in a form that may be output from the display panel 20 or a speaker. Alternatively, the main board 51 may control the driving board 53. Alternatively, the main board 51 may be connected to the display panel 20 and control the display panel 20.

The driving board 53 may be connected to the light source device 200 and control the light source device 200. The driving board 53 may apply a driving voltage and/or driving current to the light source device 200 based on a control signal of the main board 51. The driving board 53 may be connected to the light source substrate 400 (See FIG. 4) and control On/Off operation of the plurality of light sources 300 (See FIG. 4).

The power supply board 52 may supply power to the display panel 20 and the backlight unit 100 such that the backlight unit 100 outputs surface light and the display panel 20 blocks or transmits the light of the backlight unit 100.

Meanwhile, although FIG. 2 shows a PBA 50 in which the main board 51, the driving board 53, and the power supply board 52 are configured as separate components, as an example, a PBA in which the main board 51, the driving board 53, and the power supply board 52 are integrated may also be used.

Each PBA 50 may be implemented as a printed circuit board (PCB) and various circuits mounted on the PCB. For example, a power circuit may include a capacitor, a coil, a resistor, a processor, and a power circuit board on which these components are mounted. In addition, a control circuit may include a memory, a processor, and a control circuit board on which these components are mounted.

The display apparatus 1 may include a display case provided to support various parts of the main body 11 of the display apparatus 1. In other words, various parts of the main body 11 may be accommodated in the display case. The display case may define the exterior appearance of the display apparatus 1.

For example, the display case may support the display panel 20. For example, the display case may support the backlight unit 100. For example, the display case may support the main board 51. For example, the display case may support the power supply board 52. For example, the display case may support the driving board 53.

For example, the display apparatus 1 may include a top chassis 13. The top chassis 13 may include a top chassis 13 configured to support the front surface and side surfaces of the display panel 20. For example, the top chassis 13 may be provided in an approximately rectangular frame shape.

For example, the display apparatus 1 may include a bottom chassis 15. The bottom chassis 15 may cover the rear of the display panel 20. The bottom chassis 15 may be coupled to the rear of the top chassis 13. The bottom chassis 15 may support various parts of the display apparatus 1 such as the backlight unit 100, the main board 51, the power supply board 52, and the driving board 53.

The bottom chassis 15 may be formed to have an approximately flat plate shape, but is not limited thereto. The bottom chassis 15 may include a material with high thermal conductivity to dissipate heat generated in the backlight unit 100 to the outside. For example, the bottom chassis 15 may be formed of a metal material such as aluminum or SUS or a plastic material such as ABS.

For example, the display apparatus 1 may include a middle mold 14. The middle mold 14 may be disposed between the top chassis 13 and the bottom chassis 15. For example, the middle mold 14 may support at least some components of the backlight unit 100.

For example, the display apparatus 1 may include a rear cover 16. The rear cover 16 may be located behind the bottom chassis 15 and may cover the bottom chassis 15 and various parts (e.g., the main board 51, the power supply board 52, and the driving board 53) located behind the bottom chassis 15.

Meanwhile, unlike the case shown in FIG. 2, the display case of the display apparatus 1 according to an embodiment of the present disclosure may not include some components among the top chassis, the middle mold, the bottom chassis, and the rear cover.

The configuration of the display apparatus 1 described above with reference to FIG. 2 is only an example for describing the display apparatus 1 according to an embodiment of the present disclosure, and the present disclosure is not limited thereto. In various embodiments of the present disclosure, the display apparatus 1 may be provided to include various configurations to perform a function of providing an image via a screen.

Figure 3:
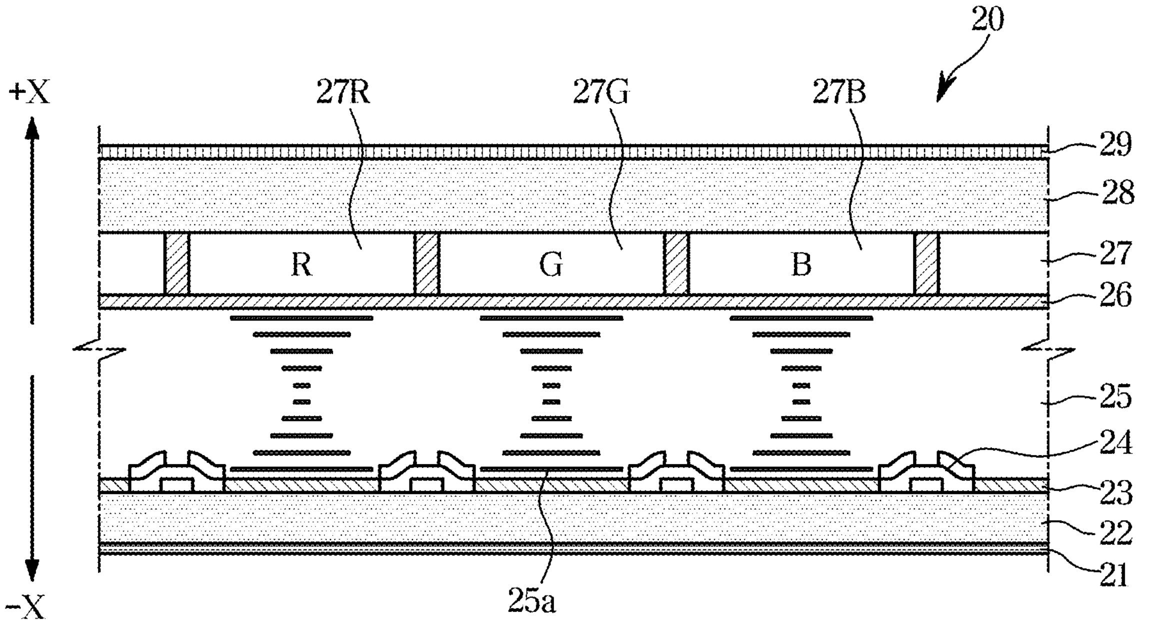
FIG. 3 is a cross-sectional view of a liquid crystal display panel included in a display apparatus according to an embodiment of the present disclosure.

FIG. 3 is a cross-sectional view of a liquid crystal display panel included in a display apparatus according to an embodiment of the present disclosure.

Referring to FIG. 3, the display panel 20 included in the display apparatus 1 according to an embodiment of the present disclosure may be implemented as a liquid crystal display (LCD) panel and configured to block or transmit light emitted from the backlight unit 100. By the operation of blocking or transmitting light emitted from the backlight unit 100 performed by the display panel 20, an image I may be formed on the front surface of the display panel 20.

The front surface of the display panel 20 may form the screen 12 of the display apparatus 1 as described above. A plurality of pixels P may be provided in the display panel 20. The plurality of pixels P provided in the display panel 20 may each independently block or transmit light of the backlight unit 100, and light passing through the plurality of pixels P may form an image I displayed on the screen 12.

For example, as shown in FIG. 3, the display panel 20 may include a first polarizing film 21, a first transparent substrate 22, a pixel electrode 23, a thin film transistor 24, a liquid crystal layer 25, a common electrode 26, a color filter 27, a second transparent substrate 28, and a second polarizing film 29.

The first transparent substrate 22 and the second transparent substrate 28 may fixedly support the pixel electrode 23, the thin film transistor 24, the liquid crystal layer 25, the common electrode 26, and the color filter 27. These first and second transparent substrates 22 and 28 may be formed of tempered glass of a transparent resin.

The first polarizing film 21 and the second polarizing film 29 may be arranged on outer sides of the first and second transparent substrates 22 and 28, respectively.

Each of the first polarizing film 21 and the second polarizing film 29 may transmit specific light and block the other light. For example, the first polarizing film 21 may transmit light having a magnetic field vibrating in a first direction and block the other light. Also, the second polarizing film 29 may transmit light having a magnetic field vibrating in a second direction and block the other light. In this case, the first direction and the second direction may be perpendicular to each other. Accordingly, a polarization direction of light passing through the first polarizing film 21 may be perpendicular to a vibration direction of light passing through the second polarizing film 29. As a result, in general, light may not be able pass through both the first polarizing film 21 and the second polarizing film 29.

A color filter 27 may be disposed on the inner side of the second transparent substrate 28.

The color filter 27 may include, for example, a red filter 27R configured to transmit red light, a green filter 27G configured to transmit green light, and a blue filter 27B configured to transmit blue light. The red filter 27R, the green filter 27G, and the blue filter 27B may be arranged sequentially. Regions where the color filters 27 are formed may correspond to the above-described pixel P. A region where the red filter 27R is formed may correspond to the red sub-pixel PR, a region where the green filter 27G is formed may correspond to the green sub-pixel PG, and a region where the blue filter 27B is formed may correspond to the blue sub-pixel PB.

The pixel electrode 23 may be disposed on the inner side of the first transparent substrate 22, and the common electrode 26 may be disposed on the inner side of the second transparent substrate 28.

The pixel electrode 23 and the common electrode 26 may be formed of an electrically conductive metal material and may generate an electric field to change the alignment of liquid crystal molecules 25*a* forming the liquid crystal layer 25 which will be described below.

The pixel electrode 23 and the common electrode 26 may be formed of a transparent material and may transmit light incident from the outside. For example, the pixel electrode 23 and the common electrode 26 may be formed of indium tin oxide (ITO), indium zinc oxide (IZO), Ag nano wire, carbon nano tube (CNT), graphene, or 3,4-ethylenedioxythiophene (PEDOT). The thin film transistor (TFT) 24 may be disposed on the inner side of the second transparent substrate 22.

The thin film transistor 24 may transmit or block a current flowing in the pixel electrode 23. For example, an electric field may be formed between the electrode 23 and the common electrode 26 or removed therefrom by turning on (closed state) or turning off (open state) the thin film transistor 24.

The thin film transistor 24 may be formed of poly-silicon and may be formed by a semiconductor process such as lithography, deposition, or ion implantation process.

The liquid crystal layer 25 may be formed between the pixel electrode 23 and the common electrode 26. The liquid crystal layer 25 may be filled with liquid crystal molecules 25*a*.

Liquid crystals exhibit an intermediate state between a solid (crystals) and a liquid. Most of liquid crystal substances are organic compounds and have a thin and long rod shape as a molecular shape. The arrangement of molecules may be irregular in some directions, but may be in the form of regular crystals in other directions. As a result, liquid crystals may have both fluidity of a liquid and optical anisotropy of crystals (solid).

In addition, liquid crystals may exhibit optical properties depending on a change in the electric field. For example, a direction of arrangement of molecules forming liquid crystals may change in accordance with a change in the electric field. Once an electric field is generated in the liquid crystal layer 25, the liquid crystal molecules 25*a* of the liquid crystal layer 25 may be aligned in the direction of the electrical field. Unless the electric field is formed in the liquid crystal layer 25, the liquid crystal molecules 25*a* are non-uniformly aligned or aligned along an alignment film. As a result, optical properties of the liquid crystal layer 25 may vary depending on the presence or absence of the electric field passing through the liquid crystal layer 25.

The structure of the display panel 20 described above with reference to FIG. 3 is only an example of structures of the display panel 20 of the display apparatus 1 according to an embodiment of the present disclosure, and the present disclosure is not limited thereto.

FIG. 4 is an enlarged view of a light source device and a reflection sheet included in a display apparatus according to an embodiment of the present disclosure.

Referring to FIG. 4, the display apparatus 1 according to an embodiment of the present disclosure may include a plurality of light sources 300 and a light source substrate 400 on which the light sources 300 are mounted. The plurality of light sources 300 and the light source substrate 400 may form the light source device 200 of the backlight unit 100.

In FIG. 4, one light source 300 among the plurality of light sources 300 included in the light source device 200 is illustrated in detail, and descriptions of the structure and functions of the light source 300 which will be given below may also be commonly applied to each of the plurality of light sources 300.

The light source 300 is configured to emit light. The light source 300 may be configured to emit light toward the display panel 20. The light source 300 may include a device configured to emit monochromatic light (light with a specific wavelength, e.g., blue light) or white light (e.g., light composed of a mixture of red light, green light, and blue light) in various directions upon the supply of power. For example, the light source 300 may include a light emitting diode (LED).

The light source substrate 400 may support the plurality of light sources 300. The light source substrate 400 may supply power allowing the light source 300 to emit light to each of the plurality of light sources 300.

The light source substrate 400 may be formed of a printed circuit board (PCB) mounted with the plurality of light sources 300 and having conductive power supply lines to supply power to the light sources 300.

The light source 300 may be provided on the front surface of the light source substrate 400. The light source 300 may be mounted on the front surface of the light source substrate 400. As used herein, the front surface of the light source substrate 400 may refer to one surface of the light source substrate 400 facing the light source device 200. That is, the light source 300 may be mounted on the light source substrate 400 to face forward and be configured to emit light in the forward direction.

The reflection sheet 120 may be disposed in front of the light source substrate 400. As described above, the reflection sheet 120 may be coupled to the front surface of the light source substrate 400. In this regard, the reflection sheet 120 may include a plurality of through-holes 120*a* formed at positions respectively corresponding to the plurality of light sources 300 of the light source device 200. As shown in FIG. 4, the light source 300 may protrude through the through-hole 120*a* to the front side of the reflection sheet 120. Accordingly, the light source 300 and the light source substrate 400 may partially be exposed to the front side of the reflection sheet 120 through the through-hole 120*a*. By this configuration, the light source 300 may emit light from the front side of the reflection sheet 120.

The reflection sheet 120 may reflect light, emitted toward the reflection sheet 120 from the light source 300, toward the diffuser plate 130.

The proceeding process of light emitted from the plurality of light sources 300 and light reflected by the reflection sheet 120 is as described above.

Hereinafter, structures of the light source 300 and the light source substrate 400 will be described in detail.

The light source 300 may include a LED 300*a*. The LED 300*a* may include a P-type semiconductor and an N-type semiconductor for emitting light by recombination of holes and electrons. In addition, the LED 300*a* may include a pair of electrodes for supplying holes and electrons to the P-type semiconductor and the N-type semiconductor, respectively.

The LED 300*a* may be configured to convert electrical energy into optical energy. The LED 300*a* may emit light having a maximum intensity at a predetermined wavelength based on the power supplied thereto. For example, the LED 300*a* may emit blue light having a peak value at a wavelength representing blue (e.g., wavelength of 430 nm to 495 nm).

For example, a multilayer reflection structure in which a plurality of insulation films having different refractive indices are alternately stacked may be disposed on the front surface of the LED 300*a*. For example, such a multilayer reflection structure may be formed of a distributed Bragg reflector (DBR).

For example, the LED 300*a* may be directly attached to the light source substrate 400 in a chip on board (COB) manner. In other words, the light source 300 may include a LED 300*a* in which a LED chip or LED die is directly attached to the light source substrate 400 without additional packaging.

Because the light source device 200 is manufacturing by attaching a flip-chip type LED 300*a* to the light source substrate 400 in the COB manner, miniaturization of the light source 300 may be realized.

The light source substrate 400 may include a substrate line 500. The substrate line 500 may be configured to transmit electrical signals and/or power from the PBA 50 to the light source 300. The substrate line 500 may be configured to supply power to the light source 300. The substrate line 500 may be configured to supply a driving voltage and/or a driving current based on a dimming signal to the light source 300. For example, the substrate line 500 may be configured to supply power to a flip-chip type LED 300*a*.

For example, the light source substrate 400 may be formed by alternately stacking a non-conductive insulation layer and a conductive conduction layer.

A circuit or pattern through which power and/or electrical signals pass may be formed in the conduction layer of the light source substrate 400. The conduction layer may be formed of various materials having electrical conductivity. For example, the conduction layer may be formed of various metal materials such as copper (Cu), tin (Sn), aluminum (Al), or any alloy thereof. The substrate line 500 may be realized by the circuit or pattern formed in the conduction layer of the light source substrate 400.

A dielectric material of the insulation layer of the light source substrate 400 may provide electrical insulation between the circuits or patterns of the conduction layer. The insulation layer may include a dielectric material for electrical insulation.

For example, a protection layer may be provided on the outer surface of the light source substrate 400 to prevent or suppress the light source substrate 400 from being damaged by external impacts, chemical actions (e.g., corrosion), and/or optical actions. For example, the protection layer of the light source substrate 400 may include a photo solder resist (PSR).

The protection layer of the light source substrate 400 may prevent the substrate line 500 from being exposed to the outside.

For example, the light source substrate 400 may include a power supply pad 440 electrically connected to the substrate line 500 and configured to supply power to the flip-chip type LED 300*a*. The substrate line 500 may be electrically connected to the LED 300*a* via the power supply pad 440.

For example, a window may be formed to expose a part of the substrate line 500 of the light source substrate 400 to the outside. The power supply pad 440 may be electrically connected to a part of the substrate line 500 exposed to the outside of the light source substrate 400.

For example, various conductive adhesive materials having electrical conductivity such as a solder and an electrically conductive epoxy adhesive may be applied between the electrodes of the LED 300*a* and the power supply pads 440.

The light source 300 may include an optical dome 300*b*. The optical dome 300*b* may cover the LED 300*a*. The optical dome 300*b* may prevent or suppress damage to the LED 300*a* caused by external mechanical actions and/or damage to the LED 300*a* caused chemical actions.

The optical dome **300*b* may have, for example, a dome shape formed by cutting a sphere along a plane that does not include the center thereof, or a hemispherical shape formed by cutting a sphere along a plane that includes the center thereof. A vertical cross-section of the optical dome 300*b*** may be, for example, arcuate or semicircular in shape.

The optical dome **300*b* may be formed of silicone or epoxy resin. For example, the optical dome 300*b* may be formed by ejecting molten silicone or epoxy resin onto the LED 300*a***, and curing the ejected silicone or epoxy resin.

The optical dome **300*b* may be optically transparent or translucent. Light emitted from the LED 300*a* may be emitted to the outside after passing through the optical dome 300*b***.

In this case, for example, the dome-shaped optical dome **300*b* may refract light like a lens. For example, light emitted from the LED 300*a* may be refracted by the optical dome 300*b*** so as to be dispersed.

The structure of the light source device 200, e.g., the light source 300 and the light source substrate 400, described above in detail with reference to FIG. 4 is only an example of the structure of the light source device 200 of the display apparatus 1 according to an embodiment of the present disclosure, and the present disclosure is not limited thereto.

Figure 5:
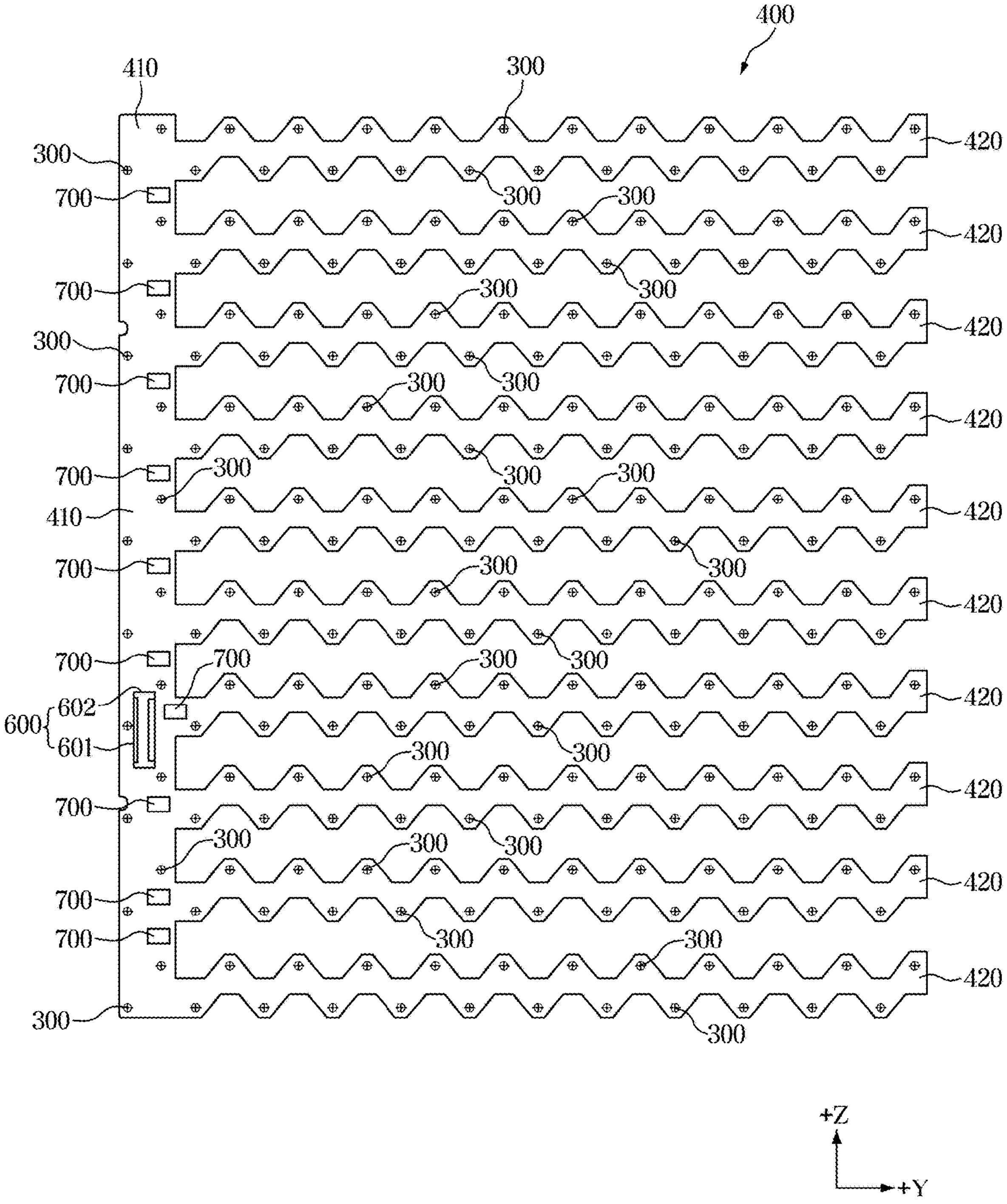
FIG. 5 is a view illustrating the front surface of a light source substrate included in a display apparatus according to an embodiment of the present disclosure.
Figure 6:
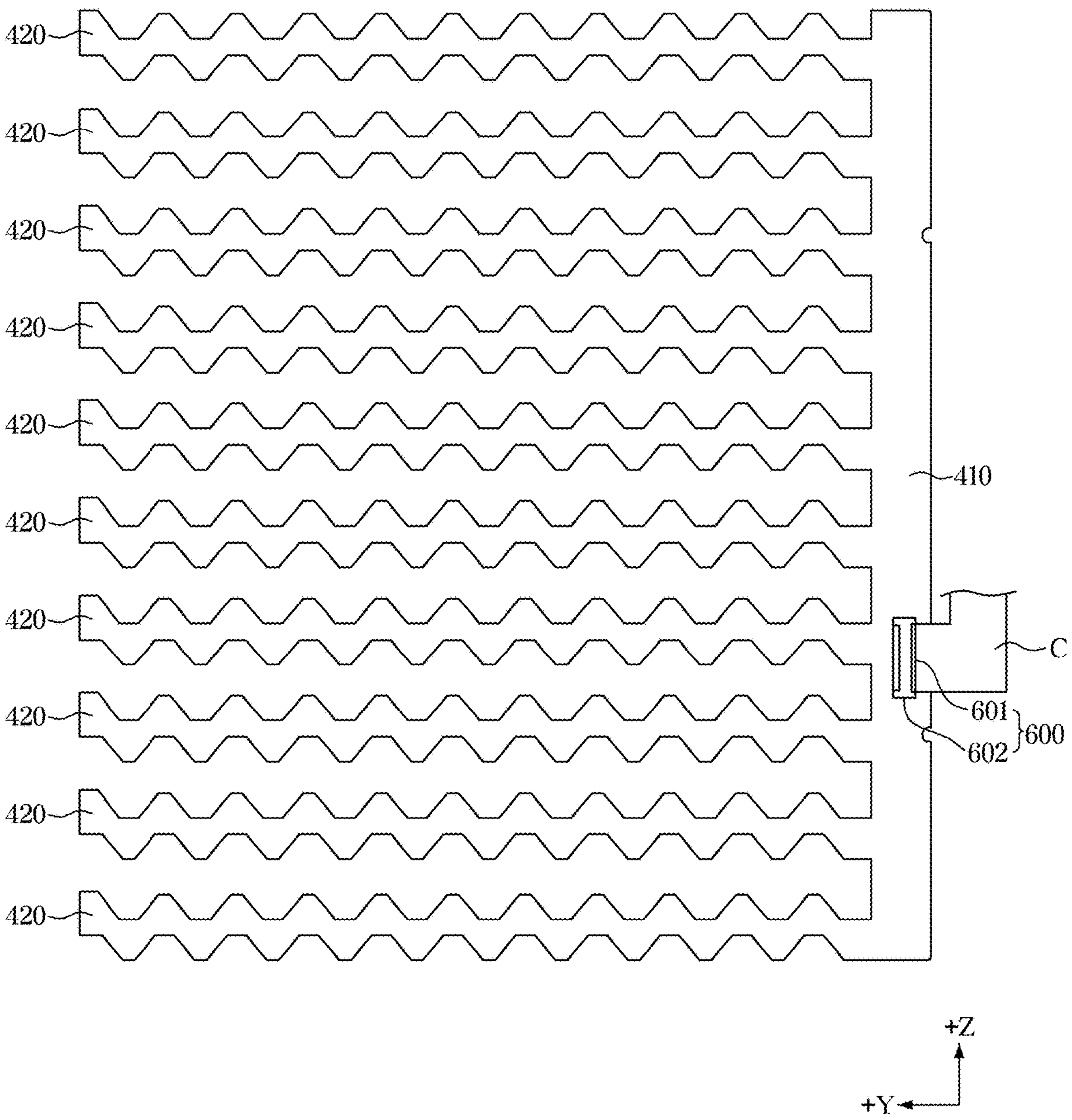
FIG. 6 is a view illustrating the rear surface of a light source substrate included in a display apparatus according to an embodiment of the present disclosure.
Figure 7:
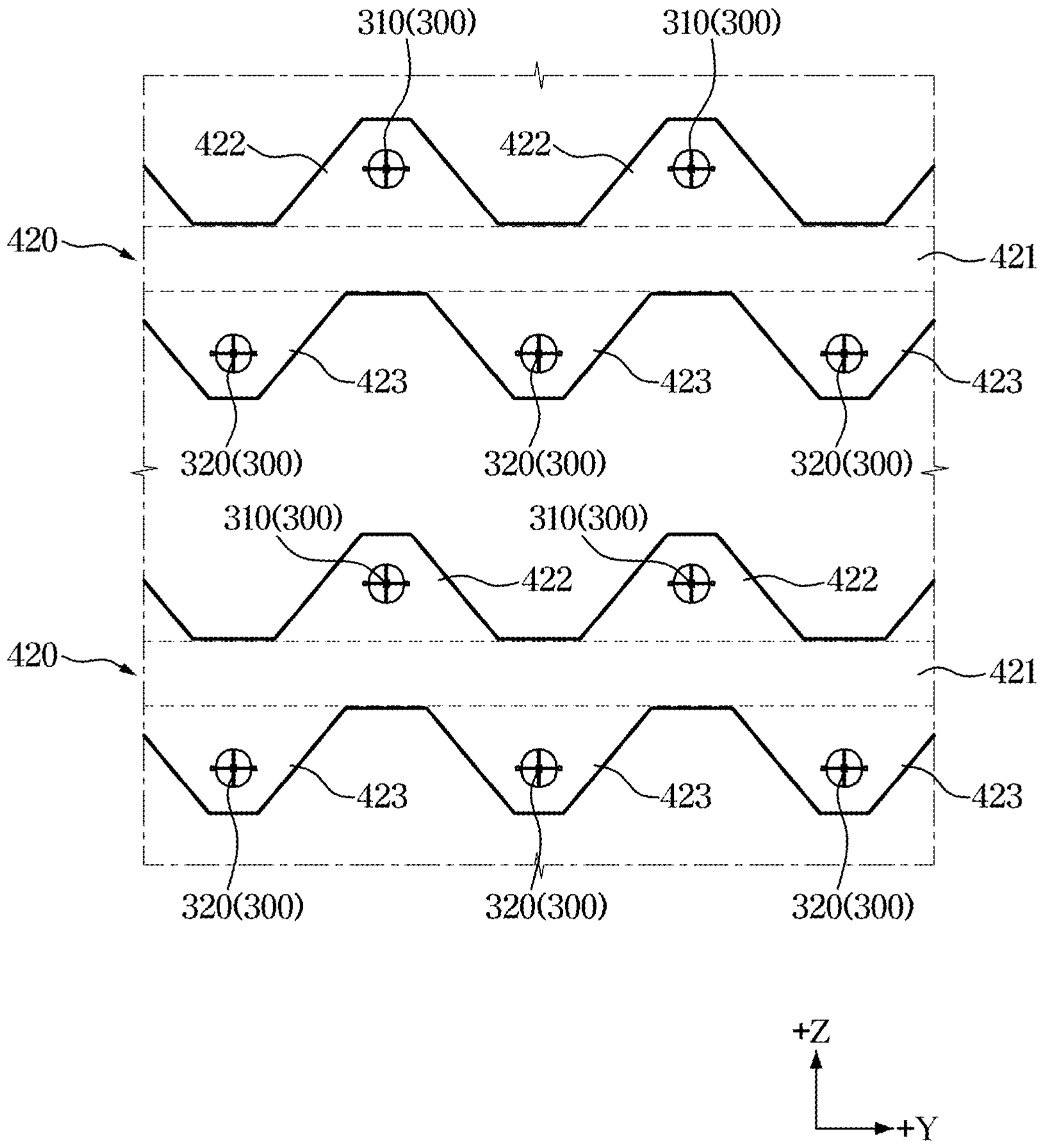
FIG. 7 is an enlarged view of some of a plurality of substrate bars of a light source substrate included in a display apparatus according to an embodiment of the present disclosure.

FIG. 5 is a view illustrating the front surface of a light source substrate included in a display apparatus according to an embodiment of the present disclosure. FIG. 6 is a view illustrating the rear surface of a light source substrate included in a display apparatus according to an embodiment of the present disclosure. FIG. 7 is an enlarged view of some of a plurality of substrate bars of a light source substrate included in a display apparatus according to an embodiment of the present disclosure.

Referring to FIGS. 5 to 7, the display apparatus 1 according to an embodiment of the present disclosure may include a plurality of light sources 300 and a light source device 200 on which the plurality of light sources 300 are mounted. As shown in FIG. 2, the display apparatus 1 according to an embodiment may include a plurality of light source devices 200, but hereinafter, a structure of one light source device 200 will be described in detail with reference to FIGS. 5 to 7 for the convenience of description.

The light source substrate 400 may be disposed in front of (in the +X direction) the bottom chassis 15. The light source substrate 400 may be mounted on the bottom chassis 15. The light source substrate 400 may be fixed to the bottom chassis 15 and supported by the bottom chassis 15.

According to an embodiment, the plurality of light sources 300 and electronic components for driving the same may be mounted and the substrate line 500 may be arranged on the front surface of the light source substrate 400, or the electronic components may not be mounted and the substrate line 500 may not be arranged on the rear surface of the light source substrate 400. That is, the light source substrate 400 may be a single-sided mounting type circuit board in which electronic components and the substrate line 500 are arranged on only one side. The light source substrate 400 may be a single-sided mounting type circuit board including a metal material. With these characteristics, manufacturing costs of the light source substrate 400 may be reduced.

The light source substrate 400 may include a plurality of substrate bars 420.

The substrate bar 420, as a component forming at least one portion of the above-described light source substrate 400, may be a component including a bar-shaped PCB extending in one direction.

At least some of the light source 300 may be mounted on each of the plurality of substrate bars 420. At least some of the plurality of light sources 300 may be mounted on the front surface of each of the plurality of substrate bars 420. In this regard, the front surface of the substrate bar 420 refers to one surface of the substrate bar 420 in a direction toward the display panel 20 from the substrate bar 420.

The plurality of substrate bars 420 may be formed as a PCB on which the light sources 300 are mounted and the above-described substrate line 500 is provided.

The plurality of substrate bars 420 may be arranged along a first direction (Z). For example, the plurality of substrate bars 420 may be arranged approximately along the vertical direction of the display apparatus 1.

The plurality of substrate bars 420 may be arranged to be spaced apart from each other. The plurality of substrate bars 420 may be arranged to be spaced apart from each other along the first direction (Z). For example, the first direction (Z), in which the plurality of substrate bars 420 are arranged to be spaced apart from each other, may be approximately parallel to the vertical direction (i.e., up-down direction) of the display apparatus 1. The plurality of substrate bars 420 may be aligned in parallel to each other at spaced-apart positions.

Each of the plurality of substrate bars 420 may be formed to have an approximate bar shape. Specifically, each of the plurality of substrate bars 420 may have a width in the first direction (Z) and may extend in a second direction (Y) different from the first direction (Z). That is, each of the plurality of substrate bars 420 may have a shape in which a length in the second direction (Y) is greater than the width in the first direction (Z). The second direction (Y) is a direction in which each of the plurality of substrate bars 420 extends and may also be referred to as a bar direction.

For example, the width direction of each of the plurality of substrate bars 420 may be approximately parallel to the vertical direction (e.g., up-down direction) of the display apparatus 1. For example, the direction in which each of the plurality of substrate bars 420 extends may be approximately parallel to the horizontal direction (e.g., lateral direction) of the display apparatus 1.

For example, the direction in which each of the plurality of substrate bars 420 extends may be parallel to a longer side direction of the display apparatus 1. For example, the width direction of each of the plurality of substrate bars 420 may be parallel to a shorter side direction of the display apparatus 1. In other words, the plurality of substrate bars 420 may be arranged along the shorter side direction of the display apparatus 1 and may extend in the longer side direction of the display apparatus 1, respectively.

The direction in which the plurality of substrate bars 420 are arranged to be spaced apart from each other may be parallel to the width direction. In other words, the plurality of substrate bars 420 may be arranged to be spaced apart from each other along the first direction (Z) that is the width direction.

Each of the plurality of substrate bars 420 may extend in a direction different from the direction where the plurality of substrate bars 420 are spaced apart from each other. According to an embodiment, each of the plurality of substrate bars 420 may extend in the direction (Y direction) perpendicular to the direction (Z direction) where the plurality of substrate bars 420 are spaced apart from each other. That is, the above-described first direction and second direction may be perpendicular to each other.

Meanwhile, the direction where the plurality of substrate bars 420 spaced apart from each other may form a preset angle with the direction where each of the plurality of substrate bars 420 extends, but the angle may not be exactly 90°.

For example, the plurality of substrate bars 420 may be arranged at uniform intervals from each other in the first direction (Z). In other words, distances between pairs of adjacent substrate bars 420 among the plurality of substrate bars 420 may be approximately the same. Accordingly, uniformity of luminance of the display apparatus 1 may be improved.

For example, the plurality of substrate bars 420 may be formed to have shapes corresponding to each other. For example, the widths of the plurality of substrate bars 420 in the first direction (Z direction) may correspond to each other. For example, lengths of the plurality of substrate bars 420 extending in the second direction (Y) may correspond to each other. For example, the plurality of substrate bars 420 may be formed in sizes corresponding to each other.

Each of the plurality of substrate bars 420 may be mounted on the bottom chassis 15. Because each of the plurality of substrate bars 420 is mounted on the bottom chassis 15 and maintained at fixed positions, the plurality of light sources 300 mounted on the plurality of substrate bars 420 may be stably disposed at designed positions, respectively.

The reflection sheet 120 may be attached to the front surface of each of the plurality of substrate bars 420.

The light source substrate 400 may include a substrate body 410. The substrate body 410, as a component forming a part of the above-described light source substrate 400, may be a component including a PCB.

The plurality of substrate bars 420 may be connected to the substrate body 410. The plurality of substrate bars 420 may be supported by the substrate body 410. For example, the plurality of substrate bars 420 may be connected to one side of the substrate body 410.

The plurality of substrate bars 420 may extend from the substrate body 410. For example, each of the plurality of substrate bars 420 may extend from the substrate body 410 in the second direction (Y). For example, each of the plurality of substrate bars 420 may extend from one side of the substrate body 410 in the second direction (Y). Each of the plurality of substrate bars 420 may extend from the substrate body 410 along the bar direction, The substrate body 410 may extend along the first direction (Z). For example, the substrate body 410 may have a shape in which a length in the first direction (Z) is greater than the width in the second direction (Y). As the substrate body 410 extends in the direction where the plurality of substrate bars 420 are arranged, a structure connected to a larger number of substrate bars 420 may be obtained. In addition, as the plurality of substrate bars 420 extend from one side of the substrate body 410 in the second direction (Y) that is the width direction (e.g., a relatively shorter side) of the substrate body 410, each of the substrate bars 420 may have a shape extending more from the substrate body 410.

The substrate body 410 may be mounted on the bottom chassis 15. Because the substrate body 410 is mounted on the bottom chassis 15 and maintained at a fixed position, the plurality of light sources 300 mounted on the substrate body 410 may be stably disposed at designed positions, respectively. Also, as the substrate body 410 is mounted on the bottom chassis 15, the plurality of substrate bars 420 connected to the substrate body 410 may be more stably supported by the substrate body 410.

For example, some of the plurality of light sources 300 may be mounted on the substrate body 410. Some of the plurality of light sources 300 may be mounted on the front surface of the substrate body 410. In this regard, the front surface of the substrate body 410 refers to one surface of the substrate body 410 in a direction toward the display panel 20 from the substrate body 410.

The substrate body 410 may be formed as a PCB on which the light sources 300 are mounted and the above-described substrate line 500 and the like are provided.

The reflection sheet 120 may be attached to the front surface of the substrate body 410. For example, a single reflection sheet 120 may be adhered to the front surfaces of the substrate body 410 and the plurality of substrate bars 420. In this case, uniformity of luminance may be improved by light reflected by the reflection sheet 120, and a process of attaching the reflection sheet 120 to the front surfaces of the substrate body 410 and the plurality of substrate bars 420 may be simplified. However, the present disclosure is not limited thereto, a plurality of reflection sheets 120, which are distinct from each other, may be attached to the front surfaces of the substrate body 410 and plurality of substrate bars 420.

According to an embodiment, the substrate body 410 may be integrated with the plurality of substrate bars 420. In other words, the substrate body 410 may be connected to the plurality of substrate bars 420 to form an integrated light source substrate 400. The light source substrate 400 may be configured as a single PCB including the substrate body 410 and the plurality of substrate bars 420.

Although FIG. 5 shows, by way of example, a case in which each of the plurality of substrate bars 420 extends in a rightward direction (+Y direction) from the substrate body 410, the present disclosure is not limited thereto, and for example, the plurality of substrate bars 420 may also extend in a leftward direction (−Y direction) from the substrate body 410.

In addition, although FIG. 5 shows, by way of example, a case in which the substrate body 410 extends in the vertical direction (Z direction) of the display apparatus 1, the present disclosure is not limited thereto, and for example, the substrate body 410 may also extend in the horizontal direction (Y direction).

Also, although FIG. 5 shows, by way of example, a case in which each of the plurality of substrate bars 420 extends in the horizontal direction (Y direction) from one side of the substrate body 410, the present disclosure is not limited thereto, and for example, each of the plurality of substrate bars 420 may extend in the vertical direction (Z direction) from one side of the substrate body 410. In this case, the plurality of substrate bars 420 may be arranged in the horizontal direction (Y direction) to be spaced apart from each other.

Also, unlike the above-described embodiment, the first direction as the width direction of the each of the plurality of substrate bars 42, the first direction in which the plurality of substrate bars 420 are arranged to be spaced apart from each other, the first direction in which the substrate body 410 extends, or the second direction in which each of the plurality of substrate bars 420 extends, may not be parallel to any one of the vertical direction (Z direction) nor the horizontal direction (Y direction) of the display apparatus 1.

However, hereinafter, a case where the first direction is parallel to the vertical direction (Z direction) of the display apparatus 1, and the second direction is parallel to the horizontal direction (Y direction) of the display apparatus 1 will be described by way of example for the convenience of explanation.

According to an embodiment, each of the plurality of substrate bars 420 may include a central extension 421 extending in one direction, and protrusions 422 and 423 protruding from the central extension 421. The central extension 421 and the protrusions 422 and 423, as parts of the substrate bar 420, may form parts of the light source substrate 400, respectively.

The central extension 421 may extend in the second direction (Y direction). The width direction of the central extension 421 may be parallel to the first direction (Z direction). The central extension 421 may have a shape in which the extending length in the second direction (Y direction) is greater than the width in the first direction (Z direction).

The central extension 421 may be located in a central area of the substrate bar 420. The central extension 421 may include an area extending in the second direction (Y direction) through the center of the substrate bar 420.

For example, as shown in FIG. 7, the central extension 421 may have an area having an approximately rectangular bar shape.

The substrate bar 420 may include a plurality of first protrusions 422 respectively protruding from one side of the central extension 421. The plurality of first protrusions 422 may protrude from one side of the central extension 421 in the first direction (Z direction), respectively. Each of the plurality of first protrusions 422 may protrude from one side of the central extension 421 toward the outside of the central extension 421. Each of the plurality of first protrusions 422 may extend from the central extension 421 in the first direction (Z direction). For example, each of the plurality of first protrusions 422 may protrude upward from the upper side of the central extension 421.

For example, the first protrusions 422 may be connected to and integrally formed with the central extension 421.

The plurality of first protrusions 422 may be arranged along the second direction (Y direction). For example, the plurality of first protrusions 422 may be arranged in the second direction (Y direction) at regular intervals.

For example, the plurality of first protrusions 422 may be formed to have shapes corresponding to each other. For example, protruding lengths of the plurality of first protrusions 422 from the central extension 421 in the first direction (Z direction) may correspond to each other.

The plurality of light sources 300 may include a plurality of first-side light sources 310 adjacent to one side of the substrate bar 420 in the first direction (Z). Each of the plurality of first-side light sources 310 may be arranged in the first protrusion 422. Each of the plurality of first-side light sources 310 may be mounted on the first protrusion 422. For example, one first-side light source 310 may be mounted on one first protrusion 422, but the embodiment is not limited thereto. The plurality of first-side light sources 310 may be disposed at positions spaced apart from the central extension 421 in the first direction (Z direction). As shown in FIG. 7, the plurality of first-side light sources 310 may be arranged to be deviated upward from the central extension 421.

The plurality of first-side light sources 310 may be arranged along the second direction (Y direction). For example, the plurality of first-side light sources 310 may be arranged in the second direction (Y direction) at regular intervals.

The substrate bar 420 may include a plurality of second protrusions 423 respectively protruding from the other side of the central extension 421. The plurality of second protrusions 423 may protrude from the other side of the central extension 421 in the first direction (Z direction), respectively. As used herein, the other side of the central extension 421 refers to a side different from the one side of the central extension 421 from which the first protrusions 422 protrude. For example, the plurality of second protrusions 423 may protrude from the other side of the central extension 421 opposite to the one side of the central extension 421 from which the plurality of first protrusions 422 protrude in a direction opposite to the protruding direction of the plurality of first protrusions 422. Each of the plurality of second protrusions 423 may protrude from the other side of the central extension 421 to the outside of the central extension 421. Each of the plurality of second protrusions 423 may extend from the central extension 421 in the first direction (Z direction). For example, each of the plurality of second protrusions 423 may protrude downward from the lower side of the central extension 421.

For example, the second protrusions 423 may be connected to and integrally formed with the central extension 421.

The plurality of second protrusions 423 may be arranged along the second direction (Y direction). For example, the plurality of second protrusions 423 may be arranged in the second direction (Y direction) at regular intervals.

For example, the plurality of second protrusions 423 may be formed to have shapes corresponding to each other. For example, protruding lengths of the plurality of second protrusions 423 from the central extension 421 in the first direction (Z direction) may correspond to each other.

For example, the protruding lengths of the plurality of first protrusions 422 from the central extension 421 may be approximately the same as the protruding lengths of the plurality of second protrusions 423 from the central extension 421, respectively.

The plurality of light sources 300 may include a plurality of second-side light sources 320 adjacent to the other side of the substrate bar 420 in the opposite side of the first-side light sources 310. Each of the plurality of second-side light sources 320 may be arranged in the second protrusion 423. Each of the plurality of second-side light sources 320 may be mounted on the second protrusion 423. Some of the plurality of light sources 300 mounted on the plurality of substrate bars 420 may be mounted on the plurality of second protrusions 423. Hereinafter, the light source mounted on each of the plurality of second protrusions 423 is referred to as second-side light source 320. For example, one second-side light source 320 may be mounted on one second protrusion 423, but the embodiment is not limited thereto.

The plurality of second-side light sources 320 may be disposed at positions spaced apart from the central extension 421 in the first direction (Z direction). As shown in FIG. 7, the plurality of second-side light sources 320 may be arranged to be deviated downward from the central extension 421.

The plurality of second-side light sources 320 may be arranged along the second direction (Y direction). For example, the plurality of second-side light sources 320 may be arranged in the second direction (Y direction) at regular intervals.

In this regard, some regions of the central extension 421 from which the plurality of first protrusions 422 protrude and other regions of the central extension 421 from which the plurality of second protrusions 423 extend may be alternately arranged along the second direction (Y direction). In other words, the first protrusions 422 and the second protrusions 423 may be alternately arranged. In a single substrate bar 420, the plurality of first protrusions 422 and the plurality of second protrusions 423 may not be not aligned with each other in the first direction (Z).

By this configuration, the first-side light source 310 and the second-side light source 320 may be arranged to alternate with each other along the second direction (Y direction). In a single substrate bar 420, the plurality of light sources 300 may be configured such that the first-side light sources 310 disposed on one side in the first direction (Z) and the second-side light sources 320 disposed on the other side are alternately arranged along the second direction (Y direction), and thus uniformity of luminance may be improved by the plurality of light sources 300. In other words, one substrate bar 420 may have a shape extending in an overall zigzag pattern, and the plurality of light sources 300 may be arranged in a zigzag pattern in the one substrate bar 420.

As the plurality of light sources 300 are arranged in each substrate bar 420 as described above, a distance between adjacent light sources 300 may be reduced between a pair of adjacent substrate bars 420 among the plurality of substrate bars 420, and luminance and uniformity of luminance of the display apparatus 1 may be improved.

The above-described shape of the substrate bar 420 is only an example of various shapes of the substrate bar 420 of the light source substrate 400 that may be included in the display apparatus 1 according to an embodiment, and the light source substrate 400 may include substrate bars 420 with various shapes.

The light source device 200 may include a connector 600. The connector 600 may be mounted on the light source substrate 400. The connector 600 may be electrically connected to the plurality of light sources 300 mounted on the light source substrate 400. The connector 600 may be connected to the substrate line 500 provided on the light source substrate 400. The connector 600 may be connected various electronic components mounted on the light source substrate 400 such as the plurality of light sources 300 via the substrate line 500. In addition, the connector 600 may be provided to be electrically connected to the driving board 53 via the cable C (See FIG. 6). In other words, the light source device 200 may be electrically connected to the driving board 53 through the connector 600. Therefore, the connector 600 may transmit electrical signals and/or power received from the driving board 53 to various electronic components mounted on the light source substrate 400 such as the plurality of light sources 300 through the substrate line 500. The plurality of light sources 300 may receive a driving voltage and/or current from the driving board 53 via the connector 600 and the substrate line 500 connected thereto.

According to an embodiment, the connector 600 may be mounted on the substrate body 410. The connector 600 may be connected to the cable C on the rear surface of the substrate body 410. As used herein, the rear surface of the substrate body 410 refers to one surface of the substrate body 410 facing the bottom chassis 15. In addition, the rear surface of the substrate body 410 refers to one surface opposite to the front surface of the substrate body 410 facing the display panel 20 and mounted with the plurality of light sources 300.

According to an embodiment, the connector 600 may be mounted on the substrate body 410 in a state penetrating the substrate body 410. A part of the connector 600 may be disposed on the front surface of the substrate body 410, and the other part of the connector 600 may be disposed on the rear surface of the substrate body 410.

According to an embodiment, the connector 600 may be formed to have a longer side 601 and a shorter side 602 that is shorter than the longer side 601. The longer side 601 of the connector 600 may be perpendicular to the shorter side 602, but is not limited thereto.

As shown in FIG. 5, in an embodiment, the longer side 601 of the connector 600 may be parallel to the first direction (Z). That is, the connector 600 may be arranged such that the longer side 601 thereof is parallel to the first direction (Z). In other words, the connector 600 may be arranged such that a length in the first direction (Z) is greater than a length in the second direction (Y) and may extend in the first direction (Z).

In a case in which the shorter side 602 of the connector 600 is parallel to the first direction (Z), the longer side 601 of the connector 600 may be arranged parallel to the second direction (Y), and accordingly, the substrate body 410 on which the connector 600 is mounted may be required to have a greater length in the second direction (Y) than the case shown in FIG. 5. In this case, the amount of materials required to manufacture the substrate body 410 may increase, and manufacturing costs of a product may increase.

However, because the longer side 601 of the connector 600 is parallel to the first direction (Z) as shown in FIG. 5, the amount of materials required to manufacture the substrate body 410 may decrease, and manufacturing costs of a product may decrease.

For example, the cable C connected to the driving board 53 may be provided to be electrically connected to the connector 600 via a connection terminal provided at the longer side 601 of the connector 600. In addition, for example, the substrate line 500 of the light source substrate 400 may be provided to be electrically connected to the connector 600 through the connection terminal provided at the longer side 601 of the connector 600.

The light source device 200 may include a plurality of driving circuits 700 mounted on the light source substrate 400. The plurality of driving circuits 700 may be configured to control at least some of light sources 300 among the plurality of light sources 300 mounted on the same light source substrate 400. The plurality of driving circuits 700 may be provided to control the driving current supplied to at least some light sources 300 among the plurality of light sources 300.

The plurality of driving circuits 700 may be mounted on the light source substrate 400 to be electrically connected to the substrate line 500. The plurality of driving circuits 700 may be electrically connected to the driving board 53 via a component such as the substrate line 500 and the connector 600.

According to an embodiment, the display apparatus 1 may perform local dimming that varies brightness of light in different areas of the light source device 200 in connection with an output image to enhance contrast ratio and reduce power consumption. For example, the display apparatus 1 may reduce brightness of light from a light source 300 corresponding to a dark area of an image to make the area darker, and may increase brightness of light from a light source 300 corresponding to a bright area to make the area brighter. Therefore, the contrast ratio of the image may be improved.

To implement the local dimming function, the plurality of light sources 300 may form a plurality of dimming blocks B (See FIGS. 8 and 10) each including a preset number of light sources 300. The plurality of light sources 300 may be classified according to a plurality of dimming blocks B.

According to an input image, the driving board 53 may control currents respectively supplied to the dimming blocks B. The driving board 53 may efficiently increase the contrast ratio by reducing a current supplied to a dimming block B corresponding a dark area of an input image, and increase a current supplied to a dimming block B corresponding to a bright area of the input image. For example, the same driving current may be supplied to the light sources 300 belonging to the same dimming block B and to the light sources 300 belonging to the same dimming block B may emit light with the same brightness. For example, different driving currents may be supplied to the light sources 300 belonging to different dimming blocks B based on dimming data, and the light sources 300 belonging to different dimming blocks B may emit light with different brightness.

The plurality of driving circuits 700 may be configured to control the plurality of dimming blocks B by outputting control signals. The plurality of driving circuits 700 may be configured to control driving currents supplied to the light sources 300 included in the plurality of dimming blocks B. Each driving circuit 700 may be configured to control a driving current of light sources included in one or more dimming blocks.

For example, the number of the plurality of driving circuits 700 mounted on one light source substrate 400 may correspond to the number of the substrate bars 420. In this case, one driving circuit 700 may control a driving current supplied to each of the dimming blocks B disposed on one substrate bar 420.

For example, the plurality of driving circuits 700 may include an integrated circuit chip configured to control a driving current supplied to at least one dimming block B such as a pixel integrated circuit (pixel IC) or active matrix integrated circuit (AM IC).

For example, the plurality of driving circuits 700 may be mounted on the front surface of the substrate body 410. As used herein, the front surface of the substrate body 410 refers to one surface of the substrate body 410 facing the display panel 20.

Figure 8:
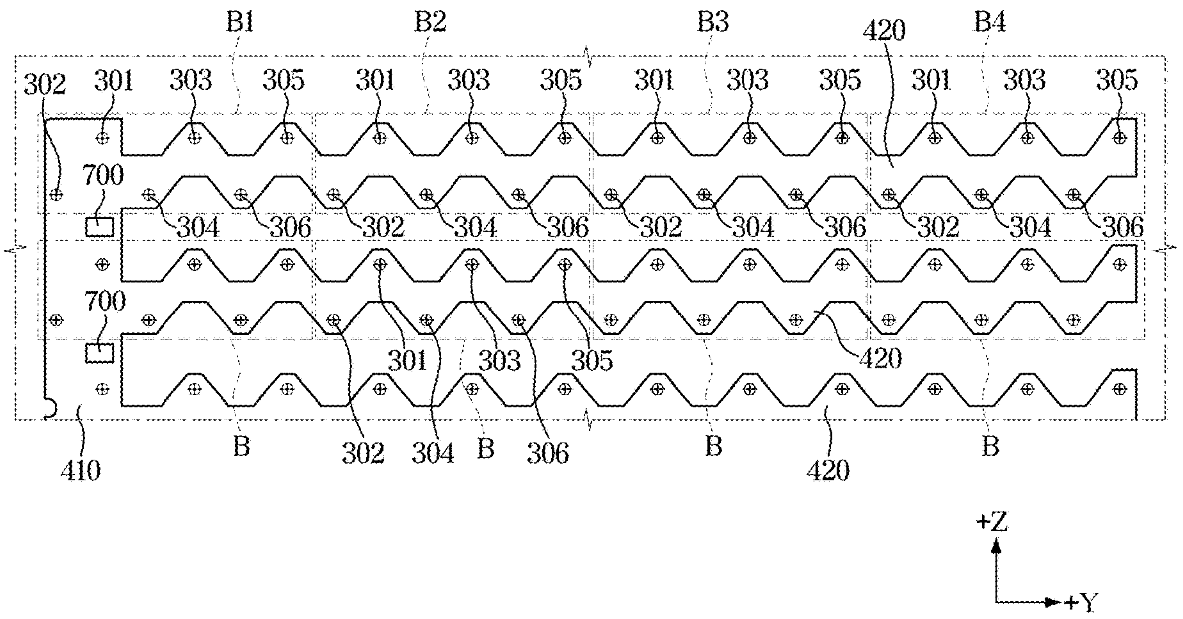
FIG. 8 is a partial enlarged view of a light source substrate included in a display apparatus according to an embodiment of the present disclosure.

FIG. 8 is a partial enlarged view of a light source substrate included in a display apparatus according to an embodiment of the present disclosure.

Referring to FIG. 8, the light source device 200 of the display apparatus 1 according to an embodiment of the present disclosure may include a plurality of dimming blocks B. Each of the plurality of dimming blocks B may include a plurality of light sources 300.

The light sources 300 included in each of the plurality of dimming blocks B may be mounted on the same substrate bar 420 or a part of the substrate body 410 adjacent to the substrate bar 420. According to an embodiment, the plurality of dimming blocks B may be divided into a first dimming block B1, a second dimming block B2, a third dimming block B3, a fourth dimming block B4, and the like from one side adjacent to the substrate body 410 to the opposite side. The number of the dimming block B shown in FIG. 8 is only an example, and the light source device 200 may include various numbers of dimming blocks B in various embodiments.

The light sources 300 included in each of the plurality of dimming blocks B may include a plurality of first-side light sources 310 adjacent to a first side (e.g., +Z direction side) of the substrate bar 420 in the first direction (Z) and a plurality of second-side light sources 320 adjacent to a second side (e.g., −Z direction side) of the substrate bar 420 in the first direction (Z).

According to an embodiment, each of the plurality of dimming blocks B may include 6 light sources 300 including a first light source 301, a second light source 302, a third light source 303, a fourth light source 304, a fifth light source 305, and a sixth light source 306. The first light source 301, the third light source 303, and the fifth light source 305 may be arranged side by side in the second direction (Y). The second light source 302, the fourth light source 304, and the sixth light source 306 may be arranged side by side in the second direction (Y). Distances of the first light source 301, the third light source 303, and the fifth light source 305 from the substrate body 410 in the second direction (Y) may increase in the order of the first light source 301, the third light source 303, and the fifth light source 305. Distances of the second light source 302, the fourth light source 304, and the sixth light source 306 from the substrate body 410 in the second direction (Y) may increase in the order of the second light source 302, the fourth light source 304, and the sixth light source 306. The first light source 301, the third light source 303, and the fifth light source 305 may be first-side light sources 310, and the second light source 302, the fourth light source 304, and the sixth light source 306 may be second-side light sources 320.

The number of the light sources 300 included in each of the dimming blocks B shown in FIG. 8 is only an example, and each of the dimming blocks B may include various numbers of light sources 300 in various embodiments.

Figure 9:
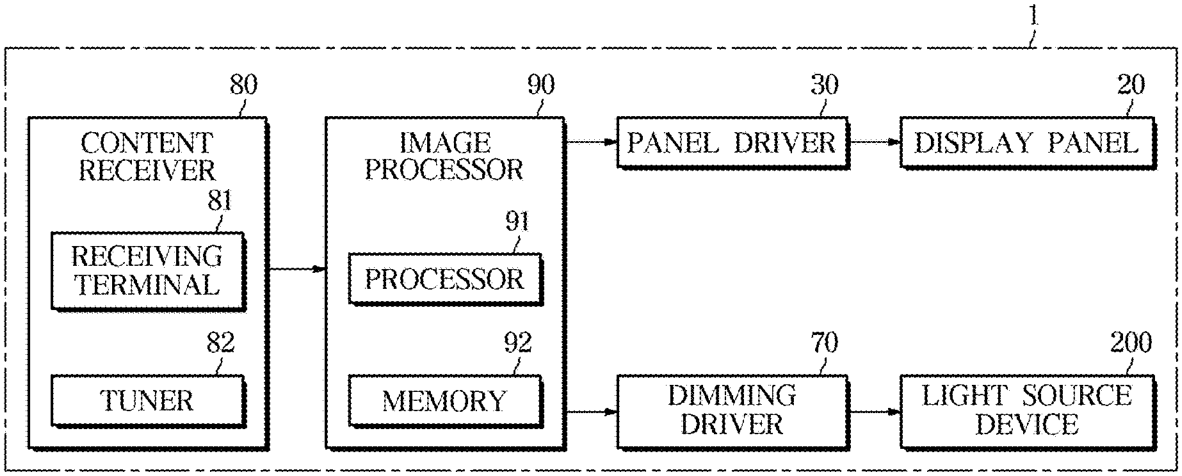
FIG. 9 is a block diagram illustrating some components of a display apparatus according to an embodiment of the present disclosure.

FIG. 9 is a block diagram illustrating some elements of a display apparatus according to an embodiment of the present disclosure.

Referring to FIG. 9, the display apparatus 1 according to an embodiment of the present disclosure may include a content receiver 80, an image processor 90, a panel driver 30, a display panel 20, a dimming driver 70, and a light source device 200.

The content receiver 80 may include a receiving terminal 81 and a tuner 82 both configured to receive content including video signals and/or audio signals from content sources.

The receiving terminal 81 may receive video signals and audio signals from the content sources via a cable. For example, the receiving terminal 81 may include a component (YPbPr/RGB) terminal, a composite video blanking and sync (CVBS) terminal, an audio terminal, a high definition multimedia interface (HDMI) terminal, a universal serial bus (USB) terminal, and the like.

The tuner 82 may receive broadcast signals from a broadcast receiving antenna or a wired cable. In addition, the tuner 82 may extract a broadcast signal of a channel selected by a user from the received broadcast signals. For example, the tuner 82 may transmit a broadcast signal having a frequency corresponding to the channel selected by the user among the plurality of broadcast signals received via the broadcast receiving antenna or the wired cable and block broadcast signals having other frequencies.

As described above, the content receiver 80 may receive video signals and audio signals from the content sources via the receiving terminal 81 and/or the tuner 82. The content receiver 80 may output the video signals and/or audio signals received via the receiving terminal 81 and/or the tuner 82 to the image processor 90.

The image processor 90 may include a processor 91 configured to process image data and a memory 92 to store programs and data for processing the image data 92.

The memory 92 may store programs and data for processing the video signals and/or audio signals. In addition, the memory 92 may temporarily store data generated while processing the video signals and/or audio signals.

The memory 92 may include non-volatile memory such as read only memory and flash memory and volatile memory such as static random access memory (S-RAM) and dynamic random access memory (DRAM).

The processor 91 may receive video signals and/or audio signals from the content receiver 80. The processor 91 may decode the video signals into image data. The processor 91 may generate dimming data from the image data. In addition, the processor 91 may output the image data and the dimming data to the panel driver 30 and the dimming driver 70, respectively.

As such, the image processor 90 may generate image data and dimming data from the video signals acquired by the content receiver 80. In addition, the image processor 90 may transmit the image data and the dimming data to the display panel 20 and the light source device 200, respectively.

The image data may include information on intensity of light transmitted by each of the plurality of pixels (or plurality of sub-pixels) included in the display panel 20. The image data may be provided to the display panel 20 via the panel driver 30.

The display panel 20 may include a plurality of pixels that may transmit or block light, and the plurality of pixels are arranged in a matrix form. In other words, the plurality of pixels may be arranged in a plurality of rows and a plurality of columns.

The panel driver 30 may receive image data from the image processor 90. The panel driver 30 may drive the display panel 20 in accordance with the image data. In other words, the panel driver 30 may convert image data that is a digital signal (hereinafter, referred to as 'digital image data') into an analog image signal that is an analog voltage signal. The panel driver 30 may supply the converted analog image signal to the display panel 20. According to the analog image signal, optical properties (such as light transmittance) of the plurality of pixels included in the display panel 20 may vary.

The panel driver 30 may include, for example, a timing controller, a data driver, and a scan driver The timing controller may receive image data from the image processor 90. The timing controller may output image data and a driving control signal to the data driver and the scan driver. The driving control signal may include a scan control signal and a data control signal. The scan control signal and the data control signal may be used to control the operations of the scan driver and the data driver, respectively.

The scan driver may receive the scan control signal from the timing controller. The scan driver may activate input of one of the plurality of rows in the display panel 20 in accordance with the scan control signal. In other words, the scan driver may convert pixels included in one row among the pixels, arranged in the plurality of rows and the plurality of columns, into a state capable of receiving analog image signals. In this regard, pixels other than those in which input is activated by the scan driver may not receive the analog image signals.

The data driver may receive image data and a data control signal from the timing controller. The data driver may output image data to the display panel 20 according to the data control signal. For example, the data driver may receive digital image data from the timing controller. The data driver may convert the digital image data into an analog image signal. In addition, the data driver may supply an analog image signal to pixels included in one row, input of which is activated by the scan driver. In this case, the pixels, input of which is activated by the scan driver, may receive the analog image signal. In accordance with the received analog image signal, optical properties (e.g., light transmittance) of the pixels, input of which is activated may vary.

As described above, the panel driver 30 may drive the display panel 20 according to the image data. As a result, an image corresponding to the image data may be displayed on the display panel 20.

In an embodiment, the dimming data may include information on intensity of light emitted from each of the plurality of light sources 300 (or plurality of dimming blocks B) included in the light source device 200. The dimming data may be transmitted to the light source device 200 via the dimming driver 70.

The image processor 90 may acquire dimming data from the image data. The image processor 90 may convert image data into dimming data in various manners. For example, the image processor 90 may divide an image I obtained by image data into a plurality of image blocks. The number of the plurality of image blocks may be the same as the number of the plurality of dimming blocks B, and the plurality of image blocks may correspond to the plurality of dimming blocks B, respectively.

The image processor 90 may obtain luminance values of the plurality of dimming blocks B from image data of the plurality of image blocks. In addition, the image processor 90 may generate dimming data by combining the luminance values of the plurality of dimming blocks B. For example, the image processor 90 may acquire luminance values of the respective plurality of dimming blocks B based on maximum values among the luminance values of pixels included in each of the image blocks.

One image block may include a plurality of pixels, and image data of one image block may include image data of a plurality of pixels (e.g., red data, green data, and blue data). The image processor 90 may calculate a luminance value of each pixel based on image data of each pixel.

The image processor 90 may determine the maximum value among luminance values of the pixels included in the image block as the luminance value of the dimming block B corresponding to the image block. For example, the image processor 90 may determine a maximum value among the luminance values of pixels included in an $i^{th}$ image block as the luminance value of the $i^{th}$ dimming block, and determine a maximum value among the luminance values of pixels included in a $j^{th}$ image block as the luminance value of the $j^{th}$ dimming block.

The image processor 90 may generate dimming data by combining the luminance values of the plurality of dimming blocks B.

The dimming driver 70 may receive dimming data from the image processor 90. The dimming driver 70 may drive the light source device 200 in accordance with the dimming data. In this regard, the dimming data may include information on luminance of each of the plurality of dimming blocks B or information on brightness of light sources included in each of the plurality of dimming blocks B.

The dimming driver 70 may include, for example, a timing controller, a data driver, and a scan driver.

The dimming driver 70 may convert dimming data that is a digital voltage signal into an analog driving current.

The dimming driver 70 may supply the analog dimming signal sequentially to the driving circuits 700 respectively corresponding to the dimming blocks B, for example, by an active matrix manner.

The plurality of dimming blocks B may be classified into a plurality of groups. For example, three dimming blocks B may form one group. The driving current may be simultaneously supplied to the dimming blocks B belonging to the same group, sequentially supplied to the dimming blocks B belonging to different groups at different timings. The dimming driver 70 may activate dimming blocks B belonging to one group among the plurality of groups and provide the analog dimming signal to the activated dimming blocks B. Thereafter, the dimming driver 70 may activate dimming blocks B belonging a different group and provide the analog dimming signal to the activated dimming blocks B.

The dimming driver 70 may activate the dimming blocks B belonging to one group and provide the analog dimming signal to the activated dimming blocks B. Thereafter, the dimming driver 70 may activate input of dimming blocks B belonging a different group and provide the analog dimming signal the activated dimming blocks B.

To activate dimming blocks B belonging to one group among the plurality of groups, the dimming driver 70 may transmit a driving signal to the driving circuit 700. The driving signal may be a signal to supply power to the driving circuit 700.

According to various embodiments, the driving signal may be directly transmitted to each of the plurality of dimming blocks B from the dimming driver 70 or transmitted to each of the plurality of dimming blocks B from the driving circuit 700.

A driving circuit of each of the dimming blocks B may supply an analog driving current corresponding to the analog dimming signal to the light sources 300. By the analog driving current, the light sources 300 may emit light. By the dimming data, light sources belonging to the same dimming block B may emit light with the same intensity. In addition, based on dimming data, light sources belonging different dimming blocks B may emit light with different intensities.

Figure 10:
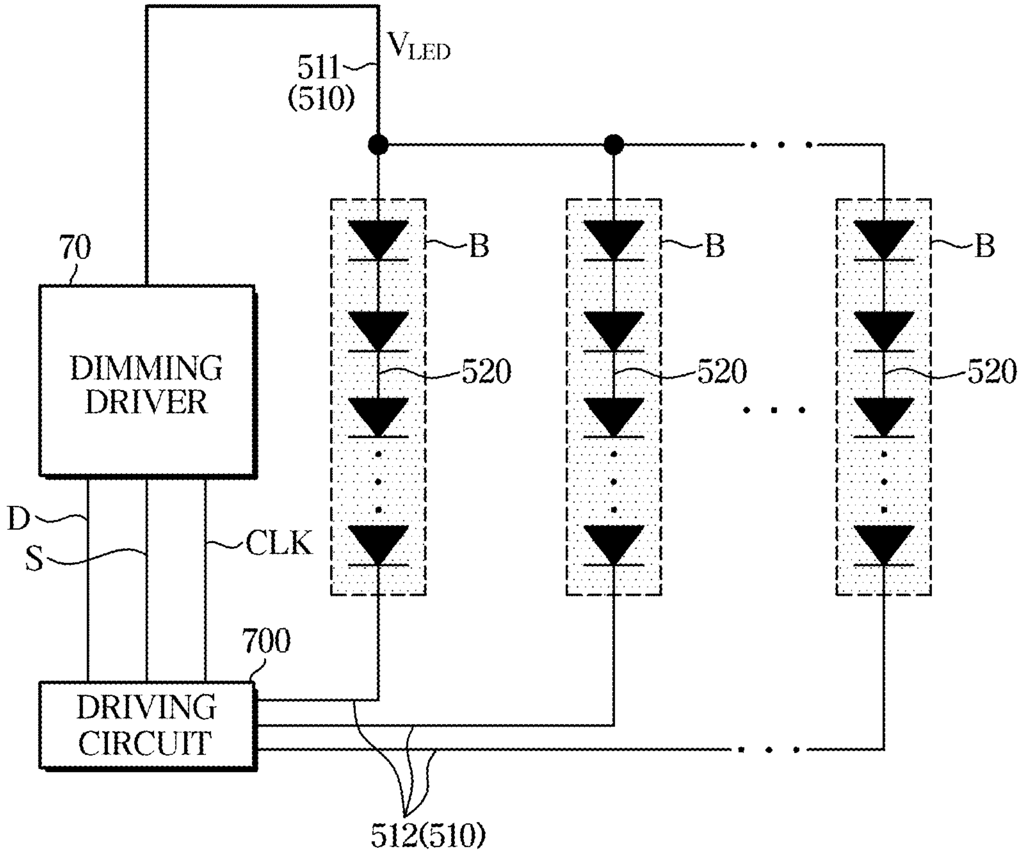
FIG. 10 is a view illustrating an example of a connection structure of a driving circuit and dimming blocks of the light source device included in a display apparatus according to an embodiment of the present disclosure.

FIG. 10 is a view illustrating an example of a connection structure of a driving circuit and dimming blocks of the light source device included in a display apparatus according to an embodiment of the present disclosure.

Referring to FIG. 10, in the display apparatus 1 according to an embodiment of the present disclosure, each of the plurality of dimming blocks B may include a plurality of light sources 300 connected in series with each other. For example, the light sources 300 included in each of the plurality of dimming blocks B may be electrically connected to each other by the substrate line 500. The substrate line 500 may include a light source inter-line connecting the light sources 300 included in each of the plurality of dimming blocks B. Because the light sources 300 belonging to the same dimming block B are connected in series with each other by the light source inter-line 520, the same driving current may be supplied to the light sources 300 belonging to the same dimming block B, and thus the light sources 300 belonging to the same dimming block B may emit light with the same brightness.

As described above, because the light sources 300 belonging to one dimming block B are connected in series with each other, the light sources 300 included one dimming block B may operate integrally and integrally form a dimming block B. Therefore, hereinafter, the expression "supplying a driving current to a dimming block" may be interpreted to have the same meaning as "supplying a driving current to light sources included in a dimming block". In addition, the expression "applying a driving voltage to a dimming block" may be interpreted to have the same meaning as "applying a driving voltage to light sources included in a dimming block".

The substrate line 500 may include a dimming block line 510 connected to the plurality of dimming blocks B, respectively. The dimming block line 510 may be connected to one light source 300 among the light sources 300 included in each of the plurality of dimming blocks B. For example, the dimming block line 510 may connect one light source 300, among the light sources 300 included in each of the plurality of dimming blocks B, and the dimming driver 70. For example, the dimming block line 510 may connect one light source 300 among the light sources 300 included in each of the plurality of dimming blocks B to the connector 600 mounted on the light source substrate 400. For example, the dimming block line 510 may connect one light source 300 among the light sources 300 included in each of the plurality of dimming blocks B and the driving circuit 700 mounted on the light source substrate 400.

Each of the plurality of dimming blocks B may receive a driving voltage VLED via the substrate line 500. Each of the plurality of dimming blocks B may receive the driving voltage VLED via the dimming block line 510. For example, the dimming block line 510 may include a voltage line 511 configured to apply the driving voltage VLED to each of the plurality of dimming blocks B. The voltage line 511 may be connected to one light source 300 among the light sources 300 included in each of the plurality of dimming blocks B. For example, driving voltages VLED applied to the plurality of dimming blocks B via the voltage line 511 may have the same intensity.

Each of the plurality of dimming blocks B may be connected to the driving circuit 700 via the substrate line 500. Each of the plurality of dimming blocks B may be connected to the driving circuit 700 via the dimming block line 510. For example, the dimming block line 510 may include a control line 512 connecting each of the plurality of dimming blocks B and the driving circuit 700. The driving circuit 700 may control a driving current flowing through each of the plurality of dimming blocks B via the control line 512.

While activated by the dimming driver 70, the driving circuit 700 may receive the analog dimming signal from the a dimming driver 70 and store the received analog dimming signal. In addition, while inactivated, the plurality of driving circuits 700 may supply a driving current corresponding to the stored analog dimming signal to the plurality of light sources 300.

The driving circuit 700 may control the driving current supplied to each of the plurality of dimming blocks B by the control line 512 in a state where the driving voltage VLED is applied to the plurality of dimming blocks B.

A signal line that provides an input signal to the plurality of driving circuits 700 may access the plurality of driving circuits 700. The signal line may include a data line D for providing an analog dimming signal to the plurality of driving circuits 700, a scan line S for providing a scan signal to the plurality of driving circuits 700, and/or a clock line CLK for providing a clock signal, as a timing signals, to the plurality of driving circuits 700.

The plurality of driving circuits 700 may include circuits having various topologies to implement a driving in an active matrix method.

For example, each of the plurality of driving circuits 700 may include a circuit having 1C2T (one capacitor, two transistors) topology. However, the circuit structure of the driving circuit 700 is not limited thereto. For example, the driving circuit 700 may include a circuit of a 3T1C topology to which a transistor for compensating for a body effect of the driving transistor is added.

The driving circuit 700 may be provided, for example, as a single chip in which a driving circuit are integrated. In other words, the driving circuit may be integrated into a single semiconductor chip.

The dimming driver 70 may transmit the data signal that is a dimming signal correspond to an input image to the plurality of driving circuits 700 via the data line D.

In addition, the dimming driver 70 may transmit the scan signal to the plurality of driving circuits 700 via the scan line.

In addition, the dimming driver 70 may transmit the clock signal corresponding to emission time of the plurality of dimming blocks B to the plurality of driving circuits 700 via the clock line CLK.

The plurality of driving circuits 700 may control the driving current supplied to each of the plurality of dimming blocks B based on the data signal, the scan signal, and/or clock signal.

Figure 11:
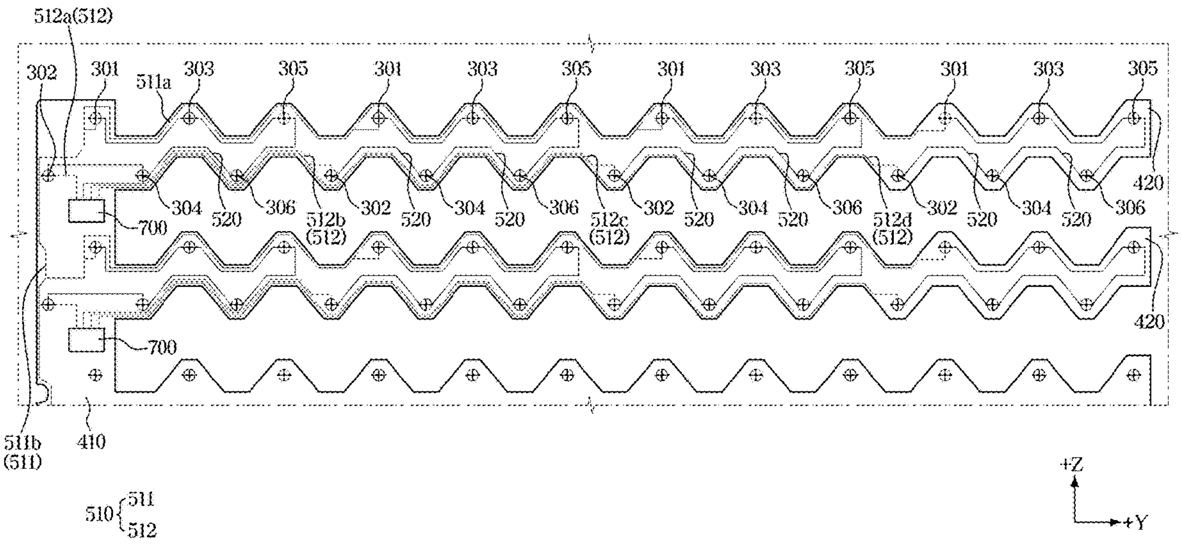
FIG. 11 is a partial enlarged view of a light source substrate included in a display apparatus according to an embodiment of the present disclosure.
Figure 12:
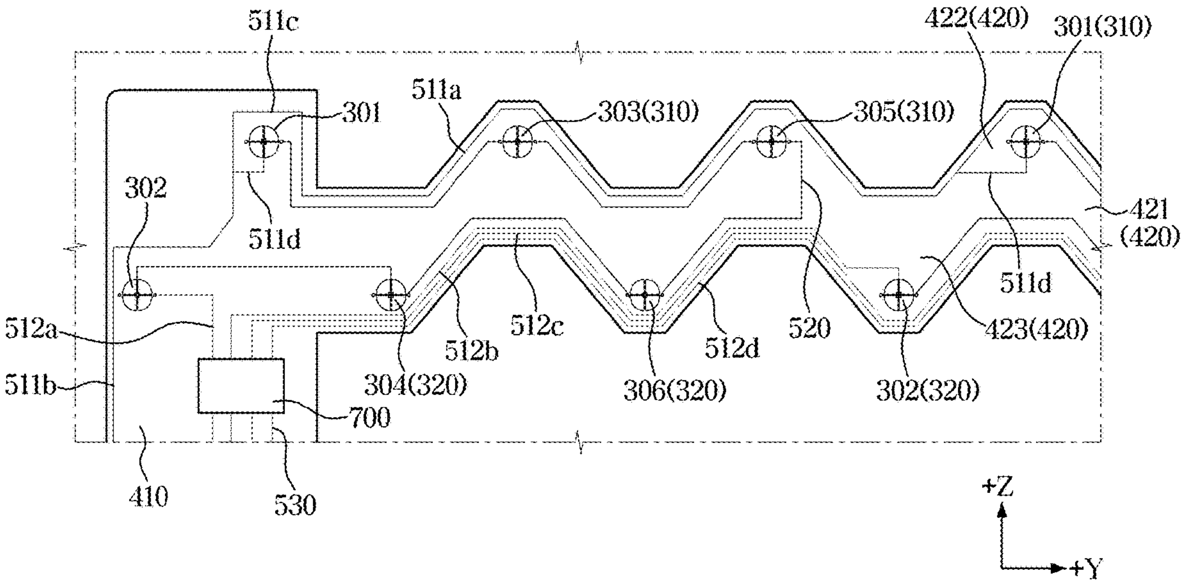
FIG. 12 is a partial enlarged view of a light source substrate included in a display apparatus according to an embodiment of the present disclosure.
Figure 13:
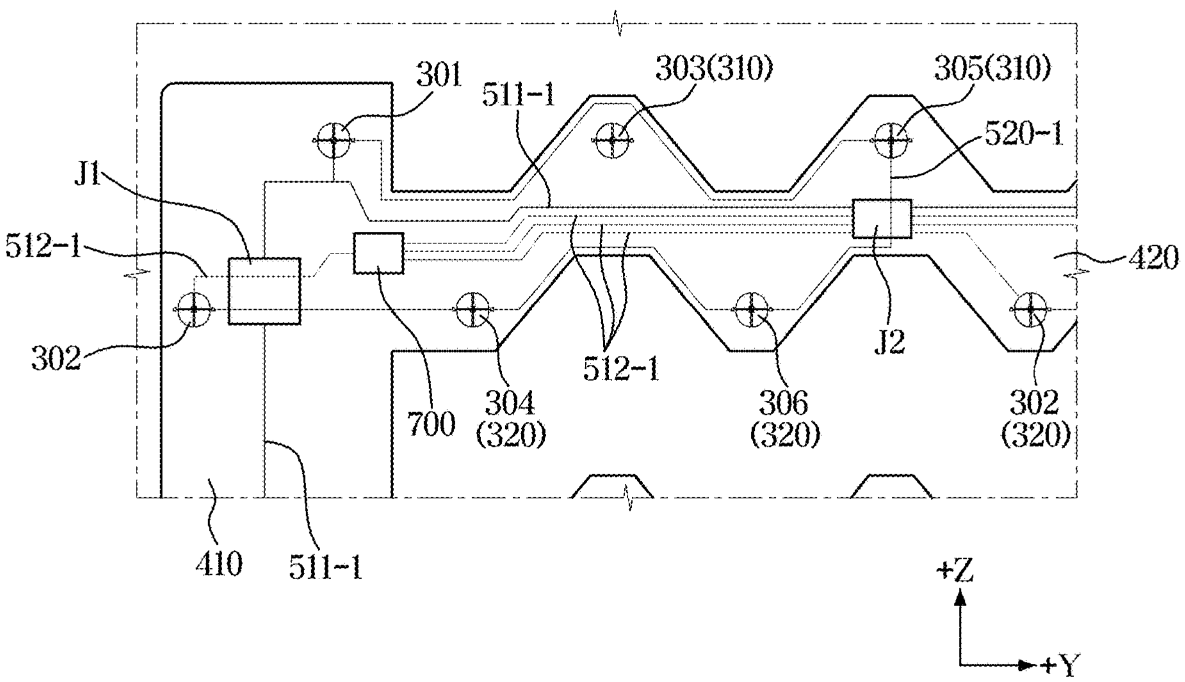
FIG. 13 is a partial enlarged view of a light source substrate included in a display apparatus according to a comparative embodiment.

FIG. 11 is a partial enlarged view of a light source substrate included in a display apparatus according to an embodiment of the present disclosure. FIG. 12 is a partial enlarged view of a light source substrate included in a display apparatus according to an embodiment of the present disclosure. FIG. 13 is a partial enlarged view of a light source substrate included in a display apparatus according to a comparative embodiment.

Referring to FIGS. 11 to 13, the substrate line 500 arranged on the light source substrate 400 of the display apparatus 1 according to an embodiment of the present disclosure may include a dimming block line 510 connected to each of the plurality of dimming blocks B, and a light source inter-line 520 connecting the light sources 300 included in the plurality of dimming blocks B.

The dimming block line 510 may be connected to one light source 300 among the light sources 300 included in each of the plurality of dimming blocks B.

The dimming block line 510 may include a voltage line 511 provided to apply a driving voltage to each of the plurality of dimming blocks B. The voltage line 511 may be connected to one light source 300 among the light sources 300 included in each of the plurality of dimming blocks B. For example, the voltage line 511 may be connected to the first light source 301 among the light sources 300 included in each of the plurality of dimming blocks B. The voltage line 511 may be connected to the connector 600. The voltage line 511 may connect the connector 600 to each of the plurality of dimming blocks B such that a driving voltage is applied to each of the plurality of dimming blocks B.

In each dimming block, the first light source 301 may be closer to the substrate body 410 than other light sources 300 aligned with the first light source 301 in the second direction (Y) (e.g., third light source 303 and fifth light source 305). Therefore, a length of the voltage line 511 connecting the connector 600 and the plurality of dimming blocks B may be relatively short, and the layout thereof may be relatively simplified.

A part of the voltage line 511 may be disposed on the plurality of substrate bars 420. The voltage line 511 may include a bar voltage line 511_a_ disposed on the plurality of substrate bars 420.

Another part of the voltage line 511 different from the bar voltage line 511_a_ may be disposed on the substrate body 410. The voltage line 511 may include a body voltage line 511_b_ disposed on the substrate body 410. The body voltage line 511_b_ may be connected to the connector 600 mounted on the substrate body 410.

The bar voltage line 511_a_ and the body voltage line 511_b_ may be connected in series. The bar voltage line 511_a_ and the body voltage line 511_b_ may be integrally formed.

The voltage line 511 may include a main line 511_c_ and branched lines 511_d_ branched from the main line 511_c_. The main line 511_c_ may be configured as an integrated line extending from the connector 600. The branched line 511_d_ may be branched from the main line 511_c_ to be connected to the first light source 301 included in each of the plurality of dimming blocks B. The branched line 511_d_ may connect the main line 511_c_ and the first light source 301 included in each of the plurality of dimming blocks B.

Each of the branched lines 511_d_ connected to the dimming blocks B corresponding to one substrate bar 420 may be branched from a single integrated main line 511_c_. As described above, in an embodiment, assuming that the dimming blocks B corresponding to one substrate bar 420 include the first dimming block B1, the second dimming block B2, the third dimming block B3, and the fourth dimming block B4, three branched lines 511_d_ may be branched from one main line 511_c_ to be connected to the first light source 301 of the first dimming block B1, the first light source 301 of the second dimming block B2, and the first light source 301 of the third dimming block B3, respectively. Because the fourth dimming block B4 is disposed at the end portion of the substrate bar 420, the main line 511_c_ may be directly connected to the first light source 301 of the fourth dimming block B4.

The dimming block line 510 may include a control line 512 configured to control the driving current supplied to each of the plurality of dimming blocks B. The control line 512 may connect the driving circuit 700 and each of the plurality of dimming blocks B. The control line 512 may connect the driving circuit 700 and the second light source 302 among the light sources 300 included in each of the plurality of dimming blocks B.

In each dimming block B, the second light source 302 may be closer to the substrate body 410 than other light sources 300 aligned with the second light source 302 in the second direction (Y) (e.g.: fourth light source 304 and sixth light source 306). Therefore, a length of the control line 512 connecting the driving circuit 700 mounted on the substrate body 410 and the plurality of dimming blocks B may be relatively short, and the layout thereof may be relatively simplified.

The control line 512 may include a plurality of control lines 512. Each of the plurality of control lines 512 may be connected to the second light source 302 included in each of the plurality of dimming blocks B. The plurality of control lines 512 may be provided in a number corresponding to the number of the plurality of dimming blocks B. For example, the control line 512 may include a first control line 512_a_ connected to the second light source 302 of the first dimming block B1, a second control line 512_b_ connected to the second light source 302 of the second dimming block B2, a third control line 512_c_ connected to the second light source 302 of the third dimming block B3, and a fourth control line 512_d_ connected to the second light source 302 of the fourth dimming block B4.

The light source inter-line 520 may connect the light sources 300 included in each of the plurality of dimming blocks B in series. For example, the light source inter-line 520 may connect the first light source 301 and the third light source 303, connect the third light source 303 and the fifth light source 305, connect the fifth light source 305 and the sixth light source 306, connect the sixth light source 306 and the fourth light source 304, and connect the fourth light source 304 and the second light source 302. The light source inter-line 520 may be provided in plural to correspond to the number of the plurality of dimming blocks B.

With this wiring structure, the first light source 301 of the dimming block B may be connected to the connector 600 by the voltage line 511, the first light source 301, the third light source 303, the fifth light source 305, the sixth light source 306, the fourth light source 304, and the second light source 302 included in the dimming block B may be connected by the light source inter-line 520, and the second light source 302 may be connected to the driving circuit 700 by the control line 512. That is, a light source 300, at a first position in the series connection (e.g., first light source 301), among the plurality of light sources 300 included in one dimming block B and connected in series, may be connected to the voltage line 511 to receive the driving voltage VLED, and a light source, at a last position in the series connection (e.g., second light source 302) may be connected to the driving circuit 700 via the control line 512.

The driving circuit 700 may be connected to another driving circuit 700 adjacent thereto or the connector 600 via a driving circuit connecting line 530 as shown in FIG. 12.

As various substrate lines 500 are arranged on the light source substrate 400, it is important to efficiently arrange the substrate lines 500 to reduce the material cost and manufacturing cost of the light source device 200. For example, in the case where there is an area in which the substrate lines 500 intersect with one another on the light source substrate 400, additional components such as jumpers may be required to avoid such intersections between the substrate lines 500. The use of such components may lead to an increase in material costs and deteriorate manufacturing efficiency. Although, according to an embodiment of using a double-sided mounting type light source substrate, in which circuits or components may be arranged on both surfaces of the substrate, it may be possible to reduce intersections between the substrate lines by arranging the substrate lines on both sides of the substrate. According to an embodiment of using a single-sided mounting type light source substrate 400 whose material costs are less expensive, it may be desirable to reduce intersections between the substrate lines 500 to lower the manufacturing costs. In addition to the reduced material costs, by reducing the intersections according to an embodiment, the overall process of manufacturing may be more efficient.

Therefore, the dimming block line 510 according to an embodiment of the present disclosure may be disposed between the plurality of light sources 300 and the edge of each of the light source substrate 400. The dimming block line 510 may be disposed closer to the edge of the light source substrate 400 than the plurality of light sources 300. The dimming block line 510 may be located closer to the edge of the light source substrate 400 than the light source inter-line 520.

For example, a part of the dimming block line 510 disposed on the plurality of substrate bars 420 may be disposed between the edge of each of the plurality of substrate bars 420 and the plurality of light sources 300. A part of the voltage line 511 disposed on the plurality of substrate bars 420 may be disposed between the edge of each of the plurality of substrate bars 420 and the plurality of light sources 300. A part of the main line 511*c* disposed on each of the plurality of substrate bars 420 may be disposed between the edge of each of the plurality of substrate bars 420 and the plurality of light sources 300. In other words, the bar voltage line 511*a* may be disposed between the edge of each of the plurality of substrate bars 420 and the plurality of light sources 300. The bar voltage line 511*a* may be disposed closer to the edge of the each of the plurality of substrate bars 420 than the light source inter-line 520.

A part of the control line 512 disposed on the plurality of substrate bars 420 may be disposed between the edge of each of the plurality of substrate bars 420 and the plurality of light sources 300. A part of the control line 512 disposed on the plurality of substrate bars 420 may be disposed closer to the edge of each of the plurality of substrate bars 420 than the light source inter-line 520. In an embodiment, the second control line 512*b*, the third control line 512*c*, and the fourth control line 512*d* may be disposed between the edge of each of the plurality of substrate bars 420 and the plurality of light sources 300, respectively. The second control line 512*b*, the third control line 512*c*, and the fourth control line 512*d* may be disposed closer to the edge of each of the plurality of substrate bars 420 than the light source inter-line 520, respectively.

Because the parts of the dimming block line 510 disposed on the plurality of substrate bars 420 are disposed between the edge of each of the plurality of substrate bars 420 and the plurality of light sources 300 and disposed closer to the edge of each of the plurality of substrate bars 420 than the light source inter-line 520, intersection between the dimming block line 510 such as the voltage line 511 and the control line 512 and the light source inter-line 520 may be prevented or reduced. In an embodiment of the present disclosure, the voltage line 511 and the control line 512 may be arranged not to intersect with a part of the light source inter-line 520 connecting the fifth light source 305 and the sixth light source 306 included in each of the plurality of dimming blocks B.

Another part of the dimming block line 510 disposed on the substrate body 410 may be disposed between the edge of the substrate body 410 and the plurality of light sources 300. Another part of the voltage line 511 disposed on the substrate body 410 may be disposed between the edge of the substrate body 410 and the plurality of light sources 300. In other words, the body voltage line 511*b* may be disposed between the edge of the substrate body 410 and the plurality of light sources 300. The body voltage line 511*b* may be disposed close to an edge of the substrate body 410 opposite to the plurality of substrate bars 420. The body voltage line 511*b* may be disposed between the edge of the substrate body 410 opposite to the plurality of substrate bars 420 and the light sources 300. For example, the body voltage line 511*b* may be disposed closer to the edge of the substrate body 410 opposite to the plurality of substrate bars 420 than the first light source 301 and the second light source 302 of the first dimming block B1.

As described above, because the parts of the dimming block line 510 disposed on the substrate body 410, particularly, the body voltage line 511*b*, is disposed between the edge of the substrate body 410 and the plurality of light sources 300, intersection between the body voltage line 511*b* and the light source inter-line 520 may be prevented or reduced. In addition, by disposing the body voltage line 511*b* close to the edge of the substrate body 410 opposite to the plurality of substrate bars 420, intersection between the first control line 512*a*, connecting the second light source 302 of the first dimming block B1 and the driving circuit 700, and the body voltage line 511*b* may be prevented and/or reduced.

To arrange the voltage line 511 and the control line 512 more efficiently in each of the plurality of substrate bars 420, the voltage line 511 and the control line 512 may be disposed on opposite sides with respect to the center of the substrate bar 420.

As described above, according to an embodiment, the plurality of light sources 300 may include a plurality of first-side light sources 310 disposed adjacent to the first side of the substrate bar 420 in the first direction (Z), and a plurality of second-side light sources 320 disposed adjacent to the second side of the substrate bar 420 opposite to the first side in the first direction (Z). In an embodiment, the voltage line 511 may be disposed between the plurality of first-side light sources 310 and the edge of each of the plurality of substrate bars 420. For example, the voltage line 511 may be disposed between the plurality of first-side light sources 310 and the first-side edge (e.g.: upper edge) of each of the plurality of substrate bars 420. The control line 512 may be disposed between the plurality of second-side light sources 320 and the edge of each of the plurality of substrate bars 420. The control line 512 may be disposed between the plurality of second-side light sources 320 and the second-side edge (e.g., lower edge) of each of the plurality of substrate bars 420.

As described above, each of the plurality of substrate bars 420 according to an embodiment may include the central extension 421, the plurality of first protrusions 422 protruding from one side of the central extension 421, and the plurality of second protrusions 423 extending from the other side of the central extension 421. In an embodiment, a part of the dimming block line 510, e.g., the voltage line 511, may be disposed along the edges of the plurality of first protrusions 422. A part of the dimming block line 510, e.g., the voltage line 511, may be disposed between the plurality of first-side light sources 310 and the edges of the plurality of first protrusions 422. Another part of the dimming block line 510, e.g., the control line 512, may be disposed along the edges of the plurality of second protrusions 423. Another part of the dimming block line 510, e.g., the control line 512, may be disposed between the plurality of second-side light sources 320 and the edge of each of the plurality of second protrusions 423.

However, unlike the embodiment shown in FIGS. 11 and 12, in various other embodiments, the control line 512 may be disposed between the plurality of second-side light sources 320 and the edge of each of the plurality of second protrusions 423, and the voltage line 511 may be disposed between the plurality of first-side light sources 310 and the edges of the plurality of first protrusions 422.

Referring to FIG. 13, a comparative embodiment different from the embodiment of the present disclosure described above with reference to FIGS. 11 and 12 will be described.

Referring to FIG. 13, according to the comparative embodiment, a voltage line 511-1 and a control line 512-1 may be disposed farther from the edge of the light source substrate 400 than the plurality of light sources 300.

In this embodiment, a part of the voltage line 511-1 disposed on the substrate body 410 may intersect with a light source inter-line 520-1 connecting the second light source 302 of the first dimming block B1 and the fourth light source 304 and/or a control line 512-1 connecting the second light source 302 of the first dimming block B1 and the driving circuit 700. Therefore, a first jumper J1, configured to transmit a part of the substrate line 500 and connecting both ends of another part of the substrate line 500, may be mounted on an intersection area of the substrate lines 500.

In this embodiment, a part of the voltage line 511-1 disposed on the substrate bar 420 may intersect with a light source inter-line 520-1 connecting the fifth light source 305 and the sixth light source 306 of the dimming block B. In addition, a part of the control line 512-1 disposed on the substrate bar 420 may intersect with the light source inter-line 520-1 connecting the fifth light source 305 and the sixth light source 306 of the dimming block B. Therefore, a second jumper J2, configured to transmit a part of the substrate line 500 and connecting both ends of another part of the substrate line 500, may be mounted on an intersection area of the substrate lines 500.

As described above, in the embodiment of FIG. 13, there may be intersections between the substrate lines 500, and the jumpers J1 and J2 need to be mounted on the intersections. Accordingly, the layout of the substrate lines 500 may become complex and inefficient, manufacturing costs such as material costs may increase, and efficiency of manufacturing processes may deteriorate.

However, as described above, according to the embodiment of the present disclosure described above with reference to FIGS. 11 and 12, the layout of the substrate lines 500 may be efficient and simplified, manufacturing costs may be reduced, and efficiency of manufacturing processes may be increased by reducing the intersections between the substrate lines 500.

Figure 14:
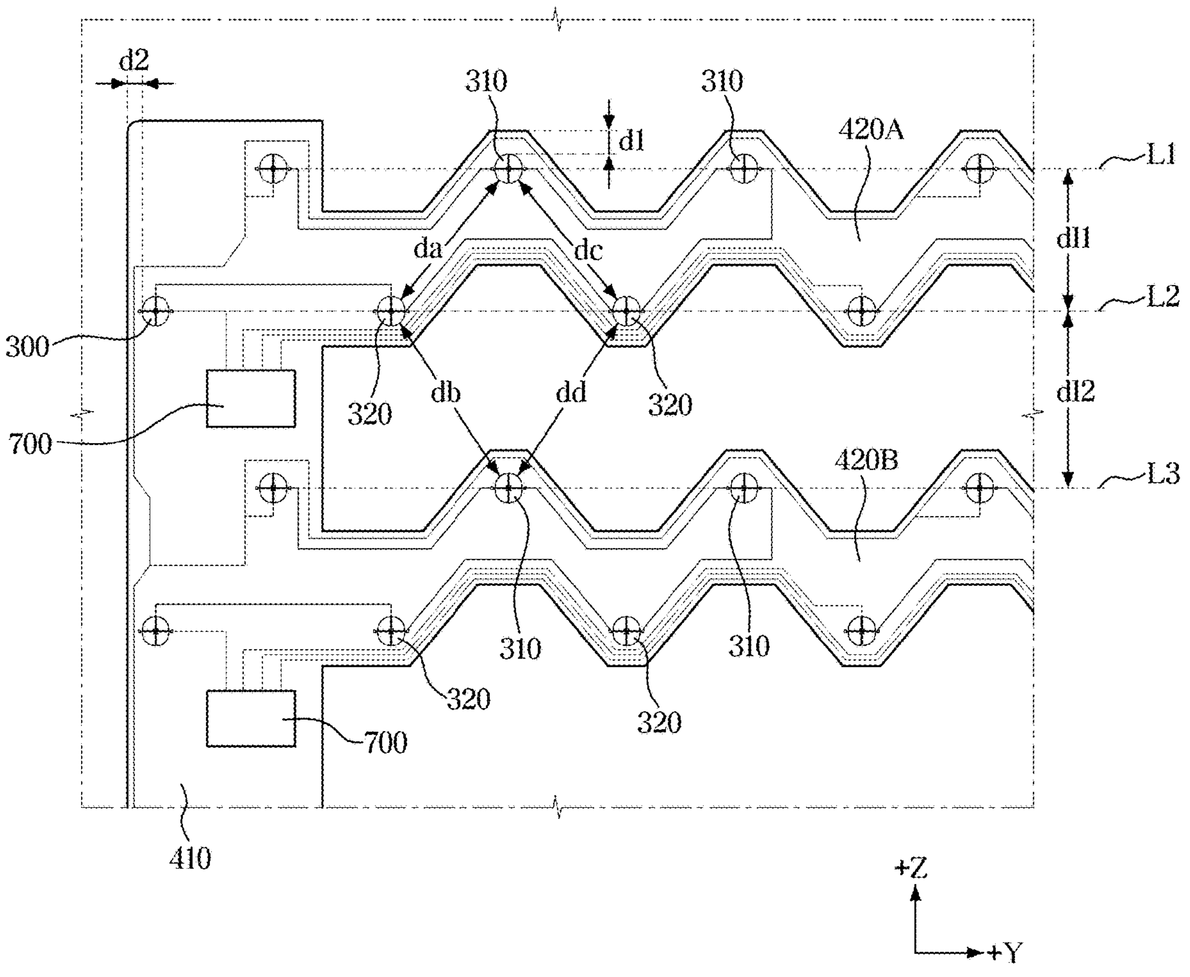
FIG. 14 is a partial enlarged view of a light source substrate included in a display apparatus according to an embodiment of the present disclosure.

FIG. 14 is a partial enlarged view of a light source substrate included in a display apparatus according to an embodiment of the present disclosure.

Referring to FIG. 14, a design of the light source device 200 according to an embodiment of the present disclosure will be described.

To arrange the dimming block line 510 closer to the edge of the light source substrate 400 than the plurality of light sources 300 as described above, a sufficient distance for spacing is required to arrange the dimming block line 510 between the plurality of light sources 300 and the edge of the light source substrate 400.

For example, a distance d1 between the first-side edge (e.g.: upper edge) of the substrate bar 420 and a first-side light source 310 needs to be designed to be sufficiently large to allow the voltage line 511 to be disposed therein. For example, the distance d1 between the first-side edge (e.g.: upper edge) of the substrate bar 420 and the first-side light source 310 may be about 3 mm or more. However, this is merely an example, and the distance may be designed variously. This may be applied to a distance between the second-side edge (e.g.: lower edge) of the substrate bar 420 and the second-side light source 320 in the same manner.

For example, a distance d2 between the edge of the substrate body 410 opposite to the substrate bars 420 and a light source 300 mounted on the substrate body 410 and disposed closest to the edge needs to be designed to be sufficiently large to allow the body voltage line 511*b* to be disposed therein. For example, the distance d2 between the edge of the substrate body 410 opposite to the substrate bars 420 and a light source 300 mounted on the substrate body 410 and disposed closest to the edge may be about 3.04 mm or more. However, this is merely an example, and the distance may be designed variously.

Based on those illustrated in FIG. 14, between a pair of adjacent substrate bars 420, a substrate bar 420A disposed on the upper side (+Z direction side) is referred to as 'first substrate bar 420A', a substrate bar 420B disposed on the lower side (−Z direction side) is referred to as 'second substrate bar 420B'. Distance between the light sources 300 mounted on the first substrate bar 420A and the light sources 300 mounted on the second substrate bar 420B will be described.

To obtain a sufficiently large distance d1 between the first-side edge (e.g.: upper edge) of the substrate bar 420 and the first-side light source 310 and a distance between the second-side edge (e.g.: lower edge) of the substrate bar 420 and the second-side light source 320, a distance between the light sources 300 disposed on one substrate bar 420 may be designed to be relatively short, but the first substrate bar 420A and the second substrate bar 420B are designed such that a distance between the light sources 300 mounted on the first substrate bar 420A and the light sources 300 mounted on the second substrate bar 420B may be designed at a predetermined distance to be relatively long.

For example, a distance da or dc between a light source 300 disposed at the edge of the first substrate bar 420A adjacent to the second substrate bar 420B (e.g.: second-side light source 320) and a light source 300 disposed at the other edge of the first substrate bar 420A opposite to the second substrate bar 420B (e.g.: first-side light source 310) may be smaller than a distance db or dd between the light source disposed at the edge of the first substrate bar 420A adjacent to the second substrate bar 420B (e.g.: second-side light source 320) and a light source disposed at an edge of the second substrate bar 420B adjacent to the first substrate bar 420A (e.g.: first-side light source 310).

For example, the distance da or dc between the first-side light source 310 and the second-side light source 320 of the first substrate bar 420A may be approximately 22 mm, but the present disclosure is not limited thereto. For example, the distance db or dd between the second-side light source 320 of the first substrate bar 420A and the first-side light source 310 of the second substrate bar 420B may be approximately 26 mm, but the present disclosure is not limited thereto.

For example, a distance dl1 between a first line L1 connecting the centers of the plurality of first-side light sources 310 mounted on the first substrate bar 420A in the second direction (Y) and a second line L2 connecting the centers of the plurality of second-side light sources 320 mounted on the first substrate bar 420A in the second direction (Y) may be smaller than a distance dl2 between the second line L2 and a third line L3 connecting the centers of the plurality of first-side light sources 310 mounted on the second substrate bar 420B in the second direction (Y).

For example, the dl1 between the first line L1 and the second line L2 may be approximately 17 mm, and the dl2 between the second line L2 and the third line L3 may be approximately 21.5 mm, but the present disclosure is not limited thereto.

However, because in this structure, the distances between the plurality of light sources 300 are not uniform, there may be a possibility that Mura is visible on a screen due to luminance differences between areas.

Therefore, it is desirable to appropriately design the distances between the light sources 300 to decrease luminance differences between regions by using high-efficiency diffuser plate 130 and optical sheet 140, thereby preventing Mura from being visible on the screen.

Figure 15:
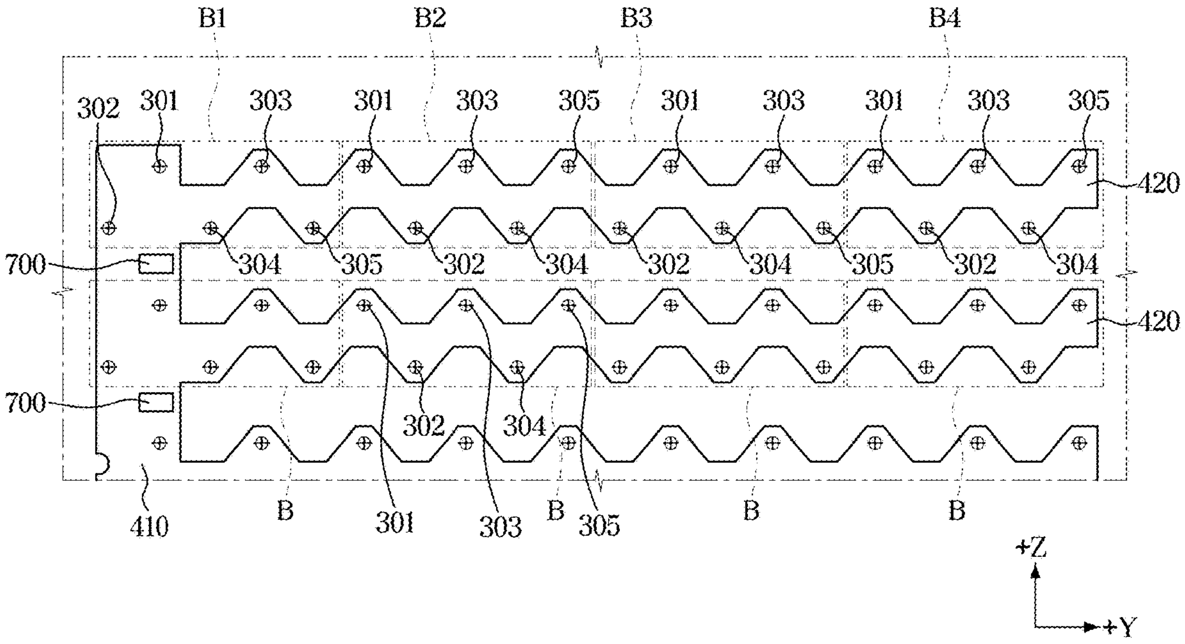
FIG. 15 is a partial enlarged view of a light source substrate included in a display apparatus according to an embodiment of the present disclosure.

FIG. 15 is a partial enlarged view of a light source substrate included in a display apparatus according to an embodiment of the present disclosure.

In the description of the configuration of the display apparatus 1 according to an embodiment of the present disclosure with reference to FIG. 15, the same reference numerals are given to the same components as components described in the embodiment of FIGS. 1 to 14, and descriptions corresponding thereto may not be repeated.

Referring to FIG. 15, a plurality of light sources 300 included in the light source device 200 of the display apparatus 1 according to an embodiment of the present disclosure may include a plurality of dimming blocks B. The plurality of light sources 300 may be formed as a plurality of dimming blocks B, each including a preset number of light sources 300. For example, the plurality of dimming blocks B may be classified into a first dimming block B1, a second dimming block B2, a third dimming block B3, and a fourth dimming block B4 from a side adjacent to the substrate body 410.

According to an embodiment, each of the plurality of dimming blocks B may include five light sources 300, including a first light source 301, a second light source 302, a third light source 303, a fourth light source 304, and a fifth light source 305. In one dimming block B (e.g.: first dimming block B1 and third dimming block B), the first light source 301 and the third light source 303 may be first-side light sources 310 aligned with each other in the second direction (Y), and the second light source 302, the fourth light source 304, and the fifth light source 305 may be second-side light sources 320 aligned with each other in the second direction (Y). According to an embodiment, in another dimming block B (e.g.: second dimming block B2 and fourth dimming block B4), the first light source 301, the third light source 303, and the fifth light source 305 may be first-side light sources 310 aligned with each other in the second direction (Y), and the second light source 302 and the fourth light source 304 may be second-side light sources 320 aligned with each other in the second direction (Y).

As described above, the number of the light sources 300 included in one dimming block B may vary according to various embodiments. Although the number of the light sources 300 included in the dimming block B is different from that described above in the embodiment shown in FIGS. 1 to 14, a part of the dimming block line 510 disposed on the substrate bar 420 may be disposed between the edge of the substrate bar 420 and the plurality of light sources 300 and disposed closer to the edge of the substrate bar 420 than the light source inter-line 520. In addition, another part of the dimming block line 510 disposed on the substrate body 410 may be disposed between the edge of the substrate body 410 and the plurality of light sources 300. Detailed descriptions on the arrangement of the substrate lines 500 such as the dimming block line 510 and the light source inter-line 520 are as given above and will not be repeated hereinafter.

Figure 16:
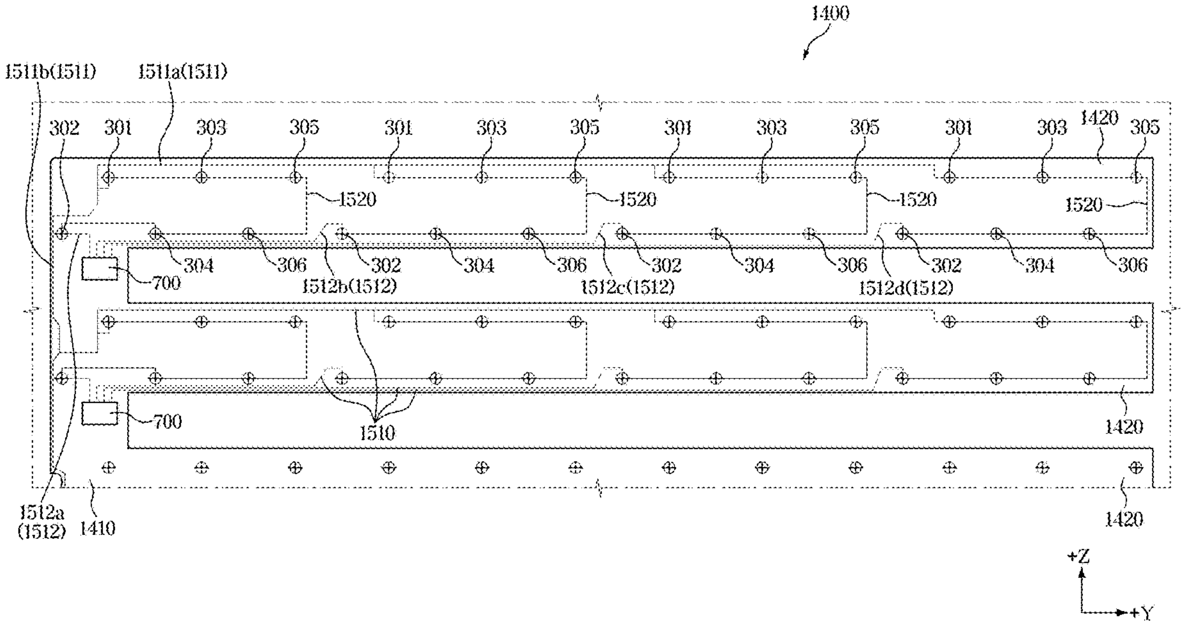
FIG. 16 is a partial enlarged view of a light source substrate included in a display apparatus according to an embodiment of the present disclosure.

FIG. 16 is a partial enlarged view of a light source substrate included in a display apparatus according to an embodiment of the present disclosure.

In the description of the configuration of the display apparatus 1 according to an embodiment of the present disclosure with reference to FIG. 16, the same reference numerals are given to the same components as components described in the embodiment of FIGS. 1 to 15, and descriptions corresponding thereto may not be repeated.

Referring to FIG. 16, the display apparatus 1 according to an embodiment of the present disclosure may include a light source substrate 1400 on which the plurality of light sources 300 are mounted. The light source substrate 1400 may include a substrate body 1410 and a plurality of substrate bars 1420 extending from one side of the substrate body 1410. Although the substrate bar 420 having a shape including the central extension 421 and the plurality of protrusions 422 and 423 extending therefrom is described by way of example in FIGS. 1 to 15, the substrate bar 1420 according to an embodiment may have a rectangular shape with an approximately uniform width along the first direction (Z) as shown in FIG. 16. That is, the substrate bar 1420 may not include separate protrusions.

On the light source substrate 1400, a dimming block line 1510 connected to one light source 300 among the light sources 300 included in each of the plurality of dimming blocks B may be disposed.

For example, the dimming block line 1510 may include a voltage line 1511 connected to the first light source 301 among the light sources 300 included in each of the plurality of dimming blocks B. The voltage line 1511 may include a bar voltage line 1511*a* disposed on the substrate bar 1420 and a body voltage line 1511*b* disposed on the substrate body 1410.

For example, the dimming block line 1510 may include a control line 1512 connected to the second light source 302 among the light sources 300 included in each of the plurality of dimming blocks B. The control line 1512 may include a first control line 1512*a* connected to the second light source 302 of the first dimming block B1, a second control line 1512*b* connected to the second light source 302 of the second dimming block B, a third control line 1512*c* connected to the second light source 302 of the third dimming block B3, a fourth control line 1512*d* connected to the second light source 302 of the fourth dimming block B4, and the like.

On the light source substrate 1400, a light source inter-line 1520 connecting the light sources 300 included in each of the dimming block B in series may be disposed.

According to an embodiment of the present disclosure, the dimming block line 1510 may be disposed between the plurality of light sources 300 and the edge of the light source substrate 1400. The dimming block line 1510 may be disposed closer to the edge of the light source substrate 1400 than the plurality of light sources 300. The dimming block line 1510 may be disposed closer to the edge of the light source substrate 1400 than the light source inter-line 1520.

For example, a part of the dimming block line 1510 disposed on the plurality of substrate bars 1420 may be disposed between the edge of each of the plurality of substrate bars 1420 and the plurality of light sources 300. A part of the voltage line 1511 disposed on the plurality of substrate bars 1420, e.g., the bar voltage line 1511*a*, may be disposed between the edge of each of the plurality of substrate bars 1420 and the plurality of light sources 300. The bar voltage line 1511*a* may be disposed closer to the edge of each of the plurality of substrate bars 1420 than the light source inter-line 1520.

A part of the control line 1512 disposed on the plurality of substrate bars 1420 may be disposed between the edge of each of the plurality of substrate bars 1420 and the plurality of light sources 300. A part of the control line 1512 disposed on the plurality of substrate bars 1420 may be disposed closer to the edge of each of the plurality of substrate bars 1420 than the light source inter-line 1520. In an embodiment, the second control line 1512*b*, the third control line 1512*c*, and the fourth control line 1512*d* may be disposed between the edge of each of the plurality of substrate bars 1420 and the plurality of light sources 300, respectively. The second control line 1512*b*, the third control line 1512*c*, and the fourth control line 1512*d* may be disposed closer to the edge of each of the plurality of substrate bars 1420 than the light source inter-line 1520, respectively.

Another part of the dimming block line 1510 disposed on the substrate body 1410 may be disposed between the edge of the substrate body 1410 and the plurality of light sources 300. Another part of the voltage line 1511 disposed on the substrate body 1410, that is, the body voltage line 1511*b*, may be disposed between the edge of the substrate body 1410 and the plurality of light sources 300. The body voltage line 1511*b* may be disposed closer to the edge of the substrate body 1410 opposite to the plurality of substrate bars 1420. The body voltage line 1511*b* may be disposed between the edge of the substrate body 1410 opposite to the plurality of substrate bars 1420 and the light sources 300. For example, the body voltage line 1511*b* may be disposed closer to the edge of the substrate body 1410 opposite to the plurality of substrate bars 1420 than the first light source 301 and the second light source 302 of the first dimming block B1.

According to an embodiment, the voltage line 1511 may be disposed between the plurality of first-side light sources 310 and the edge of each of the plurality of substrate bars 1420. Specifically, the voltage line 1511 may be disposed between the plurality of first-side light sources 310 and the first-side edge (e.g.: upper edge) of each of the plurality of substrate bars 1420. The control line 1512 may be disposed between the plurality of second-side light sources 320 and the edge of each of the plurality of substrate bars 1420. The control line 1512 may be disposed between the plurality of second-side light sources 320 and the second-side edge (e.g.: lower edge) of each of the plurality of substrate bars 1420.

By the structure as described above, intersections between the substrate lines such as the dimming block line 1510 and the light source inter-line 1520 may be prevented or reduced.

The display apparatus according to an embodiment of the present disclosure may include a display panel, a plurality of light sources configured to emit light toward the display panel, and a light source substrate mounted with the plurality of light sources and including a substrate line connected to at least some of the plurality of light sources. The light source substrate may include a substrate body extending in a first direction, and a plurality of substrate bars arranged to be spaced apart from each other in the first direction and extending from one side of the substrate body in a second direction different from the first direction. The plurality of light sources may form a plurality of dimming blocks, each including a preset number of light sources. The substrate line may include a dimming block line connected to one light source among the light sources included in each of the plurality of dimming blocks. A part of the dimming block line disposed on the plurality of substrate bars may be disposed between the edge of each of the plurality of substrate bars and the plurality of light sources.

The substrate line may further include a light source inter-line connecting the light sources included in each of the plurality of dimming blocks. A part of the dimming block line disposed on the plurality of substrate bars may be disposed closer to the edge of each of the plurality of substrate bars than the light source inter-line.

Another part of the dimming block line disposed on the substrate body may be disposed between the edge of the substrate body and the plurality of light sources.

Another part of the dimming block line disposed on the substrate body may be disposed closer to the edge of the substrate body opposite to the plurality of substrate bars.

The dimming block line may include a voltage line connected to the first light source among the light sources included in each of the plurality of dimming blocks to apply a driving voltage to each of the plurality of dimming blocks. A part of the voltage line disposed on the plurality of substrate bars may be disposed between the edge of each of the plurality of substrate bars and the plurality of light sources.

Another part of the voltage line disposed on the substrate body may be disposed between the edge of the substrate body and the plurality of light sources.

The voltage line may include a main line integrally formed and disposed between the edge of each of the plurality of substrate bars and the plurality of light sources, and a branched line branched from the main line and connected to the first light source included in each of the plurality of dimming blocks.

The first light source may be closer to the substrate body than other light sources aligned with the first light source in the second direction (Y).

The display apparatus may further include a driving circuit mounted on the light source substrate and configured to control the driving current supplied to the light sources included in each of the plurality of dimming blocks. The dimming block line may include a control line connecting the driving circuit and the second light source among the light sources included in each of the plurality of dimming blocks. The control line may be disposed between the edge of each of the plurality of substrate bars and the plurality of light sources.

The substrate line may further include a light source inter-line connecting the light sources included in each of the plurality of dimming blocks. The control line may include a plurality of control lines. The plurality of control lines may be disposed closer to the edge of each of the plurality of substrate bars than the light source inter-line.

The second light source may be closer to the substrate body than the other light sources aligned with the second light source in the second direction in the dimming block.

Each of the plurality of substrate bars may include a central extension extending in the second direction, a plurality of first protrusions protruding from one side of the central extension outward from the central extension in the first direction and mounted with some of the plurality of light sources, and a plurality of second protrusions protruding from another side of the central extension outward from the central extension in the first direction and mounted with others of the plurality of light sources. A part of the dimming block line may be disposed along the edges of the plurality of first protrusions. Another part of the dimming block line may be disposed along the edges of the plurality of second protrusions.

The plurality of light sources may include a plurality of first-side light sources disposed on the plurality of first protrusions, and a plurality of second-side light source disposed on the plurality of second protrusions. A part of the dimming block line may be disposed between the plurality of first-side light sources and the edges of the plurality of first protrusions. Another part of the dimming block line may be disposed between the plurality of second-side light sources and the edges of the plurality of second protrusions.

The dimming block line may further include a voltage line connected to the first light source among the light sources included in each of the plurality of dimming blocks to apply a driving voltage to each of the plurality of dimming blocks, and a control line connected to the second light source among the light sources included in each of the plurality of dimming blocks to control a driving current supplied to each of the plurality of dimming blocks. The voltage line may be disposed between the plurality of first-side light sources and the edges of the plurality of first protrusions. The control line may be disposed between the plurality of second-side light sources and the edges of the plurality of second protrusions.

The plurality of substrate bars may include a first substrate bar and a second substrate bar adjacent to each other. A distance between a light source disposed at an edge of the first substrate bar adjacent to the second substrate bar and a light source disposed at an edge of the first substrate bar opposite to the second substrate bar may be smaller than a distance between a light source disposed at the edge of the first substrate bar adjacent to the second substrate bar and a light source disposed at an edge of the second substrate bar close to the first substrate bar.

The display apparatus according to an embodiment of the present disclosure may include a display panel, a plurality of light sources configured to emit light toward the display panel, and a light source substrate mounted with the plurality of light sources and including a substrate line connected to at least some of the plurality of light sources. The light source substrate may include a substrate body extending in a first direction, and a plurality of substrate bars arranged to be spaced apart from each other in the first direction and extending from one side of the substrate body in a second direction different from the first direction. The plurality of light sources may form plurality of dimming blocks, each including a preset number of light sources. The substrate line may include a light source inter-line connecting the light sources included in each of the plurality of dimming blocks, and a dimming block line connected to one light source among the light sources included in each of the plurality of dimming blocks and disposed between the light source inter-line and the edge of each of the plurality of substrate bars.

The display apparatus may further include a driving board, a connector mounted on the light source substrate and electrically connected to the driving board, and a driving circuit mounted on the light source substrate, electrically connected to the connector, and configured to control a driving current supplied to the t sources included in each of the plurality of dimming blocks. The dimming block line may further include a voltage line connecting the connector and the first light source among the light sources included in each of the plurality of dimming blocks to apply a driving voltage to each of the plurality of dimming blocks, and a control line connecting the driving circuit and the second light source among the light sources included in each of the plurality of dimming blocks.

The plurality of light sources may include a plurality of first-side light sources disposed close to the first side of each of the plurality of substrate bars in the first direction, and a plurality of second-side light sources disposed close to the second side of each of the plurality of substrate bars in the first direction. The voltage line may be disposed between the plurality of first-side light source and the edge of each of the plurality of substrate bars. The control line may be disposed between the plurality of second-side light source and the edge of each of the plurality of substrate bars.

Each of the plurality of substrate bars may include a central extension extending in the second direction, a plurality of first protrusions protruding from one side of the central extension outward from the central extension in the first direction and mounted with some of the plurality of light sources, and a plurality of second protrusions protruding from the other side of the central extension outward from the central extension in the first direction and mounted with others of the plurality of light sources. A part of the dimming block line may be disposed along the edges of the plurality of first protrusions. Another part of the dimming block line may be disposed along the edges of plurality of second protrusions.

The display apparatus according to an embodiment of the present disclosure may include a plurality of light sources forming a plurality of dimming blocks each including a preset number of light sources, and a plurality of substrate bars mounted with the plurality of substrates and including a diming block line connected to one light source among the light sources included in each of the plurality of dimming blocks, where the substrate bars are arranged to be spaced apart from each other in the first direction and extend in the second direction different from the first direction. The plurality of light sources may include a plurality of first-side light sources disposed on the first side of each of the plurality of substrate bars in the first direction, and a plurality of second-side light sources disposed on the second side of each of the plurality of substrate bars in the first direction. The dimming block line may include a voltage line configured to apply a driving voltage to each of the plurality of dimming blocks and disposed between the plurality of first-side light sources and the edges of the plurality of substrate bars, and a control line configured to control a driving current supplied to each of the plurality of dimming blocks and disposed between the plurality of second-side light sources and the edges of the plurality of substrate bars.

According to the present disclosure, the dimming block line such as the voltage line and the control line are disposed between the light sources and the edge of the light source substrate, so as not to intersect with the light source inter-line, and thus layout efficiency of the substrate line may be improved.

According to the present disclosure, by disposing the dimming block line such as the voltage line and the control line not to intersect with the light source inter-line, the number of electronic parts mounted on the light source substrate may be reduced.

According to the present disclosure, by reducing intersections between the substrate lines, the substrate lines may be efficiently arranged even on the single-sided mounting type light source substrate.

According to the present disclosure, by increasing efficiency of the layout of the substrate lines on the light source substrate and reducing the number of electronic parts mounted thereon, efficiency of the manufacturing process may be improved and manufacturing costs may be reduced.

Effects that may be achieved by the concepts of the disclosure are not limited to the above-mentioned effects, and other effects not mentioned will be clearly understood by one of ordinary skill in the technical field to which the disclosure belongs.

So far, various embodiments have been shown and described, however, these embodiments are merely example embodiments, and the disclosure is not limited to these embodiments. It should be interpreted that various modifications may be made by one of ordinary skill in the technical art to which the disclosure belongs, without deviating from the gist of the technical concept of the disclosure.

What is claimed is:

1. A display apparatus comprising:
- a display panel;
- a plurality of light sources configured to emit light toward the display panel; and
- a light source substrate on which the plurality of light sources are provided,
- wherein the light source substrate comprises:
  - a substrate body extending in a first direction;
  - a plurality of substrate bars spaced apart from each other in the first direction and extending from one side of the substrate body in a second direction that is different from the first direction; and
  - a substrate line connected to at least some of the plurality of light sources,
- wherein the at least some of the plurality of light sources are provided as a plurality of dimming blocks on a first substrate bar, each dimming block comprising a preset number of light sources among the at least some of the plurality of light sources,
- wherein the substrate line comprises a dimming block line connected to at least one light source of each of the plurality of dimming blocks,
- wherein at least one portion of the dimming block line is between an edge of the first substrate bar and the at least some of the plurality of light sources, and
- wherein at least one second portion of the dimming block line is between an edge of the substrate body and the at least some of the plurality of light sources.

2. The display apparatus according to claim 1, wherein the substrate line further comprises a light source inter-line connecting the light sources of each dimming block among the plurality of dimming blocks, and
- wherein the at least one portion of the dimming block line is closer to the edge of the first substrate bar than the light source inter-line.

3. The display apparatus according to claim 1, wherein the at least one second portion of the dimming block line is adjacent to the edge of the substrate body, and
- wherein the edge of the substrate body is opposite to the plurality of substrate bars.

4. The display apparatus according to claim 1, wherein the dimming block line comprises a voltage line connected to a first light source of each dimming block among the plurality of dimming blocks, the voltage line configured to apply a driving voltage to each of the plurality of dimming blocks, and
- wherein a portion of the voltage line is between a first edge of the first substrate bar and the at least some of the plurality of light sources.

5. The display apparatus according to claim 4, wherein a second portion of the voltage line is between the edge of the substrate body and the at least some of the plurality of light sources.

6. The display apparatus according to claim 4, wherein the voltage line comprises:
- a main line integrally formed between the first edge of the first substrate bar and the at least some of the plurality of light sources; and
- a branched line branched from the main line and connected to the first light source of each dimming block among the plurality of dimming blocks.

7. The display apparatus according to claim 4, wherein among the light sources of each dimming block, one or more light sources are aligned with the first light source in the second direction, and the first light source is closer to the substrate body than the one or more light sources.

8. The display apparatus according to claim 1, further comprising a driving circuit on the light source substrate and configured to control a driving current supplied to the light sources of the plurality of dimming blocks,
- wherein the dimming block line comprises a control line connecting the driving circuit and a second light source of each dimming block, and
- wherein the control line is between a second edge of the first substrate bar and the at least some of the plurality of light sources.

9. The display apparatus according to claim 8, wherein the substrate line further comprises a light source inter-line connecting the light sources of each dimming block among the plurality of dimming blocks, wherein the control line comprises a plurality of control lines, and wherein the plurality of control lines are closer to the second edge of the first substrate bar than the light source inter-line.

10. The display apparatus according to claim 8, wherein, among the light sources of each dimming block, one or more light sources are aligned with the second light source in the second direction, and the second light source is closer to the substrate body than the one or more light sources.

11. The display apparatus according to claim 1, wherein each of the plurality of substrate bars comprises:

a central extension extending in the second direction;

a plurality of first protrusions protruding from a first side of the central extension in the first direction and provided with some of the plurality of light sources; and a plurality of second protrusions protruding from a second side of the central extension in the first direction and provided with others of the plurality of light sources, wherein, on the first substrate bar, a first portion of the dimming block line is provided along edges of a plurality of first protrusions of the first substrate bar, and wherein a second portion of the dimming block line is provided along edges of a plurality of second protrusions of the first substrate bar.

12. The display apparatus according to claim 11, wherein the at least some of the plurality of light sources comprise:

a plurality of first-side light sources on the plurality of first protrusions of the first substrate bar; and a plurality of second-side light sources on the plurality of second protrusions of the first substrate bar, wherein the first portion of the dimming block line is between the plurality of first-side light sources and the edges of the plurality of first protrusions, and wherein the second portion of the dimming block line is between the plurality of second-side light sources and the edges of the plurality of second protrusions.

13. The display apparatus according to claim 12, wherein the dimming block line further comprises:

a voltage line connected to a first light source of each dimming block among the plurality of dimming blocks and configured to apply a driving voltage to each of the plurality of dimming blocks; and a control line connected to a second light source of each dimming block among the plurality of dimming blocks and configured to control a driving current supplied to each of the plurality of dimming blocks, wherein the voltage line is between the plurality of first-side light sources and the edges of the plurality of first protrusions, and wherein the control line is between the plurality of second-side light sources and the edges of the plurality of second protrusions.

14. The display apparatus according to claim 1, wherein the plurality of substrate bars comprise the first substrate bar, and a second substrate bar adjacent to the first substrate bar, and wherein a distance between a light source at a first edge of the first substrate bar that is adjacent to the second substrate bar and a light source at a second edge of the first substrate bar that is opposite to the second substrate bar is less than a distance between the light source at the first edge of the first substrate bar and a light source at an edge of the second substrate bar that is adjacent to the first substrate bar.

15. A display apparatus comprising:

a display panel;

a light source substrate; and a plurality of light sources on the light source substrate and configured to emit light toward the display panel, wherein the light source substrate comprises:

a substrate body extending in a first direction;

a plurality of substrate bars spaced apart from each other in the first direction and extending from one side of the substrate body in a second direction that is different from the first direction; and a substrate line connected to at least some of the plurality of light sources, wherein each of the plurality of substrate bars comprises:

a central extension extending in the second direction; and a plurality of protrusions protruding from a side of the central extension in the first direction and provided with the at least some of the plurality of light sources, wherein the at least some of the plurality of light sources are provided as a plurality of dimming blocks on a first substrate bar, each dimming block comprising a preset number of light sources among the at least some of the plurality of light sources, wherein the substrate line comprises a dimming block line connected to at least one light source of each of the plurality of dimming blocks, wherein at least one portion of the dimming block line is between an edge of the first substrate bar and the at least some of the plurality of light sources, and wherein at least one second portion of the dimming block line is between an edge of the substrate body and the at least some of the plurality of light sources.

16. The display apparatus of claim 15, wherein the dimming block line comprises a voltage line connected to a first light source of each dimming block among the plurality of dimming blocks, the voltage line configured to apply a driving voltage to each of the plurality of dimming blocks, and wherein a portion of the voltage line is between a first edge of the first substrate bar and the at least some of the plurality of light sources.

17. The display apparatus of claim 16, further comprising a driving circuit on the light source substrate and configured to control a driving current supplied to the light sources of the plurality of dimming blocks, wherein the dimming block line comprises a control line connecting the driving circuit and a second light source of each dimming block, and wherein the control line is between the edge of the first substrate bar and the at least some of the plurality of light sources.

18. The display apparatus of claim 17, wherein the plurality of protrusions comprise:

a plurality of first protrusions protruding from a first side of the central extension in the first direction outward from the central extension and provided with some of the plurality of light sources; and a plurality of second protrusions protruding from a second side of the central extension in the first direction outward from the central extension and provided with others of the plurality of light sources, and wherein the at least some of the plurality of light sources comprise:

a plurality of first-side light sources on the plurality of first protrusions; and a plurality of second-side light sources on the plurality of second protrusions.

19. The display apparatus of claim 18, wherein the voltage line is between the plurality of first-side light sources and edges of the plurality of first protrusions, and wherein the control line is between the plurality of second-side light sources and edges of the plurality of second protrusions.

* * * * *